(12) United States Patent
Cho

(10) Patent No.: US 7,042,799 B2
(45) Date of Patent: May 9, 2006

(54) WRITE CIRCUIT OF DOUBLE DATA RATE SYNCHRONOUS DRAM

(75) Inventor: Yong Deok Cho, Icheon-Shi (KR)

(73) Assignee: Hynix Semiconductor Inc., Kyungki-do (KR)

( * ) Notice: Subject to any disclaimer, the term of this patent is extended or adjusted under 35 U.S.C. 154(b) by 154 days.

(21) Appl. No.: 10/880,381

(22) Filed: Jun. 29, 2004

(65) Prior Publication Data

US 2005/0141331 A1     Jun. 30, 2005

(30) Foreign Application Priority Data

Dec. 30, 2003    (KR)    ................  10-2003-0100162

(51) Int. Cl.
    *G11C 8/00*    (2006.01)
(52) U.S. Cl. ...................... 365/233; 365/193
(58) Field of Classification Search ................ 365/233, 365/193

See application file for complete search history.

(56) References Cited

U.S. PATENT DOCUMENTS

| | | |
|---|---|---|
| 6,154,418 A | 11/2000 | Li |
| 6,205,046 B1 | 3/2001 | Maesako |
| 6,240,042 B1 | 5/2001 | Li |
| 6,563,747 B1 | 5/2003 | Faue |
| 6,611,475 B1 * | 8/2003 | Lin ............................ 365/233 |
| 6,621,747 B1 | 9/2003 | Faue |
| 2003/0053471 A1 | 3/2003 | Stief |
| 2003/0156481 A1 | 8/2003 | Fujisawa |
| 2004/0022088 A1 | 2/2004 | Schaefer |

FOREIGN PATENT DOCUMENTS

| | | |
|---|---|---|
| JP | 2000-222877 | 8/2000 |
| JP | 2002-222591 | 8/2002 |

* cited by examiner

*Primary Examiner*—Michael Tran
(74) *Attorney, Agent, or Firm*—Marshall, Gerstein & Borun LLP

(57) ABSTRACT

Provided is a write circuit of a DDR SDRAM, in which a clock domain crossing is generated from a writing driver during a data write operation and a proper data is always transferred to a gio bus line by using the delay of an internal data strobe signal's falling for a certain amount of time as an input data strobe bar signal. Moreover, by using a skew detection circuit, it is possible to detect a skew tDQSS between a clock and a data strobe, and the skew tDQSS is automatically compensated by the skew compensation circuit. From the perspective of a timing error between the clock and the data strobe, therefore, the write operation of the DDR SDRAM has twice the timing margin (0.5tCK) compared to that of the related art. This means that a stable, high-speed write operation of the DDR SDRAM can be made possible.

18 Claims, 12 Drawing Sheets

WRITE CIRCUIT OF DOUBLE DATA RATE SYNCHRONOUS DRAM

This application relies for priority upon Korean Patent Application No. 2003-0100162 filed on Dec. 30, 2003, the contents of which are herein incorporated by reference in their entirety.

BACKGROUND

1. Field of the Invention

The present invention relates in general to a write circuit of a Double Data Rate Synchronous DRAM (DDR SDRAM), and more particularly, to a write circuit of a DDR SDRAM, in which a clock domain crossing is generated from a writing driver during a data write operation and a proper data is always transferred to a gio bus line by using the delay of an internal data strobe signal's falling for a certain amount of time as an input data strobe bar signal, and at the same time, time is compensated when a skew is generated between a clock signal and a data strobe signal, thereby realizing a high-speed operation of a memory device.

2. Discussion of Related Art

Recently, a lot of attention has been paid to an interface with an external device to keep pace with a rapidly increasing operation speed of a DDR SDRAM. For example, in case of a data read operation, not only clock-related parameters tAC (DQ output access time from CK, /CK), tDQSCK (DQS output access time from CK, /CK) but all aspects of signal integrity including output slew rate, jitter, data eye, and duty also should be considered to realize a high speed operation for a mounting application. Fortunately though, the parameters like tAC and tDQSCK are provided with a DLL (Delay Locked Loop) circuit for adjusting a skew between a clock and data output in the DDR SDRAM, so it is relatively easy to adjust a parameter value.

On the other hand, in the case of a data write operation, both a data strobe's parameters tWPRE (write preamble), tWPST (write postamble) and parameters tDQSS (write command to first DQS rising edge) indicating a skew between a clock and a data strobe are important parameters. In the data write operation, however, the length of a clock and the length of a data strobe signal line on a PCB (Printed Circuit Board) for the mounting application are not often coincident, and input capacitance values thereof are also different. As a result of this, a skew is generated all the time.

Therefore, even though a tDQSS value for the mounting falls outside the permissible range from tDQSS_Min (=0.75tCK) to tDQSS_Max(=1.25tCK) or is within the permissible range, if a timing margin lacks due to any change in process, voltage, or temperature in a clock domain crossing area where an internal data strobe ids generated inside a chip an internal clock iclk meet, a malfunction occurs during the write operation.

To provide further details on the above problem, FIG. 1 presents a block diagram associated with a related art write operation, and its relevant timing diagrams are illustrated in FIG. 2, FIG. 3, and FIG. 4, respectively.

FIG. 1 is a block diagram of a write operation in a related art DDR SDRAM, and its structure and operations will be explained in the following.

A data input buffer 101 inputs an input data DIN and outputs an n-bit data, and the n-bit data is inputted to first and second n-bit data registers 108 and 109.

A data strobe generator 104 outputs a data strobe rising signal dsr and a data strobe falling signal dsf by using a data strobe DS inputted through a data strobe buffer 102. The data strobe rising signal dsr and the data strobe falling signal dsf are inputted to the first and second n-bit data registers 108 and 109, respectively. In case that a data is inputted on the rising edge of clock, the data strobe rising signal dsr is inputted to the first n-bit data register 108, while in case that a data is inputted on the falling edge of clock, the data strobe falling signal dsf is inputted to the second n-bit data register 109.

The first n-bit data register 108 inputs an n-bit data and a data strobe rising signal dsr, and the second bit data register 109 inputs an n-bit data and a data strobe falling signal dsf. Also, a third n-bit data register 110 inputs the data stored in the first n-bit data register 108 and the data strobe falling signal dsf. In this way, the data on the rising edge of the clock as well as the data on the falling edge of the clock are arranged on the falling edge of the data strobe. Here, the data inputted to the first and second n-bit data registers 108 and 109 should satisfy setup time and hold time of the internal data strobe, i.e., the data strobe rising signal dsr and the data strobe falling signal dsf, respectively.

Two kinds of n-bit data algn_rdata and algn_fdata arranged in the data strobe falling signal dsf are inputted to a multiplexer 113 through first and second delay units 111 and 112. The multiplexer 113 outputs an n-bit data mux_r-data, mux_fdata by using those signals. The output data mux_rdata, mux_fdata of the multiplexer 113 are inputted to a 2n-bit data register 114.

A clock generator 105 generates an internal clock iCLK by inputting a clock CLK and its inversion signal /CLK which are inputted through a clock input buffer 103. The internal clock iCLK generated by the clock generator 105 is inputted to an input data strobe generator 106 and a write strobe generator 107. The input data strobe generator 106 inputs the internal clock iCLK and a start address flag flag_SA and outputs a data input strobe even signal dinstb_e and a data input odd signal dinstb_o, and these signals are inputted to the 2n-bit data register 114. Here, the start address flag, flag_SA has a low or a high state value, depending whether a start address during a write operation is even or odd. For instance, if the start address is even, the data input strobe even signal dinstb_e is generated, while if the start address is odd, the data input strobe odd signal dinstb_o is generated. In addition, a write strobe generator 107 that has input the internal clock iCLK outputs a write strobe signal wtstb, and this signal is inputted to first and second write drivers 117 and 118.

The 2n-bit data register 114 changes, in response to the data input strobe even signal dinstb_e and the data input strobe odd signal dinstb_o outputted from the input data strobe generator 106, a clock domain of the data mux_rdata and mux_fdata outputted from the multiplexer 113, and classifies the data into an even data gio_edata and an odd data gio_odata. The even data gio_edata and the odd data gio_odata outputted from the 2n-bit data register 114 are inputted to the first and second write drivers 117 and 118 through first and second gio bus lines 115 and 116. However, if the timing between the output data mux_rdata and mux_f-data of the multiplexer 113 and the output signal dinstb_e and dinstb_o of the data strobe generator 106 is not right, a proper data cannot be transferred through first and second gio bus lines 115 and 116. After all, the timing is determined by a skew (or skews) between the internal data strobe falling signal dsf and the input data strobe signals dinstb_e and dinstb_o. These skews should be optimized in order to maximize a timing margin on both sides, by checking tDQSS_Min value as well as tDQSS_Max value of the data strobe signal DS and then adjusting delays of the first and second delays means 111 and 112 and the internal clock delay of the input data strobe generator 106. However, optimizing the skew against all changes in process, voltage and temperature is not always easy in real conditions. Especially in the case of a graphic memory with a high-speed operation, the tDQSS_Min and tDQSS_Max values are extremely small, so an even greater amount of efforts is required to control the skew more strictly.

Lastly, the first and second write drivers 117 and 118 store n-bit data gio_edata, gio_odata inputted through the first and second gio bus lines 115 and 116 in a DRAM core 119. More specifically, the write drivers are synchronized with a write strobe signal wtstb, which is generated by the write strobe generator 207 using the internal clock iCLK, and load the data on a local input/output (lio) bus line. In this case, the timing of the data write strobe signal wtstb is determined in consideration of the delays of the first and second gio bus lines 115 and 116 to the input data strobe signals dinstb_e and dinstb_o, and the set up time and the hold time of the first and second write drivers 117 and 118, respectively.

FIG. 2 and FIG. 3 are timing diagrams at tDQSS_Min and tDQSS_Max of the related art DDR SDRAM in FIG. 1.

FIG. 2 illustrates waveforms of each signal when a write command is inputted at T0, a burst length BL is 4, tDQSS is 0.75tCK, and a start address SA is even. At T1, the rising edge of the data strobe DS is inputted faster than the rising edge of the clock CLK by 0.25tCK. As a result, at T2, the input data strobe even signal dinstb_e, which is generated a short delay after the internal clock iCLK, has a shorter premargin pre_margin than the post margin post_margin for the output data of the multiplexer mux_rdata and mux_fdata.

On the other hand, FIG. 3 illustrates waveforms of each signal when a write command is inputted at T0, a burst length BL is 4, tDQSS is 1.25tCK, and a start address SA is odd. At T1, the rising edge of the data strobe DS is inputted later than the rising edge of the clock CLK by 0.25tCK. As a result, at T2, the input data strobe odd signal dinstb_o, which is generated a short delay after the internal clock iCLK, has a shorter premargin pre_margin than the post margin post_margin for the output data of the multiplexer mux_rdata and mux_fdata.

These two examples are illustrated in FIG. 4. FIG. 4 shows both cases where tDQSS and tDQSS values are faster or slower than the clock CLK. The timing diagram shows conditions for input data strobe signals dinstb_e and dinstb_o to obtain a maximum timing, and write pass and write fail conditions at the same time, in both cases of the multiplexer's output data mux_rdata/mux_fdata@tDQSS (fast) and mux_rdata/mux_fdata@tDQSS(slow).

As shown in FIG. 4, supposing that td=|tskew_dinstb−tskew_dsf−td_mux| and that the data delay time of the first and second delay units 111 and 112 explained in FIG. 1 is 0, for the input data strobe signals dinstb_e and dinstb_o to obtain a maximum timing margin from both perspectives of premargin, pre_margin, and post margin, post_margin, for the output data from the multiplexer, td should be equal to 0, i.e., td=0. That is to say, a relational expression tskew_dinstb=tskew_dsf+td_mux should be satisfied. In reality, however, it is almost impossible to satisfy the condition td=0 because of changes in process, voltage and temperature. Therefore, it is important to ensure that td is within a pass region. In such case, a condition of td<tvalid_data/2 should be satisfied, and since tvalid_data=tCK−(tDQSS_Max−tDQSS_Min)=0.5tCK within the permissible range of tDQSS_Min=0.75t CK and tDQSS_Max=1.25tCK, a condition of td<0.25tCK should be satisfied.

In the case of a graphic memory operating at tCK=3 ns (frequency=666 MHz), a maximum permissible skew td for all conditions including process, voltage and temperature should not exceed 0.75 ns. In fact, the maximum permissible skew td should be even smaller than 0.75 ds to leave a little margin. Also, as the operation frequency gets higher, the skew td of input data strobe signals dinstb_e and dinstb_o for the output data from the multiplexer should be controlled within an extremely small range, which, in reality, is a very difficult task to accomplish.

SUMMARY OF THE INVENTION

The present invention is directed to a write circuit of a DDR SDRAM, which is capable of performing a stable data write operation even at a very high frequency by detecting a skew between a clock and a data strobe signal during a write operation of the DDR SDRAM and compensating timing difference between signals.

Another object of the present invention is to provide a write circuit of a DDR SDRAM, in which a clock domain crossing is generated during a data write operation and a proper data is always transferred to a gio bus line by using the delay of an internal data strobe signal's falling for a certain amount of time as an input data strobe bar signal.

To accomplish the above objects, the present invention suggests to move a position where clock domain crossing occurs to a write driver and to use the delay of an input data strobe falling signal dsf for a certain amount of time as input data strobe bar signals dinstb_e and dinstb_o, thereby ensuring that a proper data is always transferred to a gio bus line. Moreover, a timing margin between a clock and a data strobe is much increased by using a skew detector to detect a skew tDQSS between a clock and a data strobe and automatically compensating the skew tDQSS through a skew compensation circuit using a direct synchronous mirror delay type DLL (Delay Locked Loop).

One aspect of the present invention is to provide a write circuit of a DDR SDRAM, including: a multiplexer for outputting, in response to a data strobe rising signal and a data strobe falling signal, a data on the rising edge and the falling edge; an input data strobe generator for outputting, according to a start address flag, a data input strobe even signal and a data input strobe odd signal by using the data strobe falling signal; a skew detector for detecting a skew between an internal clock and an internal data strobe signal and outputting a skew detection signal; a skew compensation circuit for controlling, in response to the skew detection signal, the internal clock and outputting a prewrite strobe signal with the skew compensated; a write strobe generator for outputting, in response to the prewrite strobe signal, a write strobe signal; a data register for classifying, in response to the data input strobe even signal and the data input strobe odd signal, a output data from the multiplexer into an even data and an odd data, and outputting the data through first and second gio bus lines; and first and second write driver for synchronizing the output data with the write strobe signal and inputting the data to a DRAM core through first and second local input/output bus lines.

Preferably, the write address flag has values in different states, depending on whether the start address is even or odd during a write operation.

If the start address flag is an even address, the input data strobe generator generates the data input strobe even signal, and if the start address flag is an odd address, the input data strobe generator generates the data input strobe odd signal.

Preferably, the skew detector includes: a detector for detecting, after an ACTIVE command and a WRITE command are inputted, the skew caused by delay of the internal strobe signal relatively to the internal clock; and a controller for controlling the detector to detect skew only when the WRITE command is inputted for the first time after the ACTIVE command is inputted.

Preferably, the detector includes: a first NAND gate for inputting, in response to a control signal of the controller, the internal clock and the delayed internal clock by a certain amount of time, and outputting a clock rising signal on the rising edge of the internal clock; a second NAND gate for inputting, in response to the control signal of the controller, the internal data strobe signal and the delayed internal data strobe signal by a certain amount of time, and outputting a data strobe rising signal on the rising edge of the internal data strobe signal; and a latch for latching, in response to the control signal of the controller, the clock rising signal and the data strobe rising signal, and outputting the skew detection signal.

Preferably, the controller includes: a first signal generator for generating a WRITE signal, in response to the WRITE command; a second signal generator for generating an ACTIVE signal, in response to an ACTIVE signal and a precharge signal; a first NOR gate for inputting the internal clock and the delayed internal clock by a certain amount of time and outputting a clock falling signal on the falling edge of the internal clock; a second NOR gate for inputting the internal data strobe signal and the delayed internal data strobe signal by a certain amount of time and outputting a data strobe falling signal on the falling edge of the internal data strobe; a first NAND gate for outputting, in response to the clock falling signal, the WRITE signal and the ACTIVE signal, a write signal for synchronizing the WRITE command to the falling edge of the internal clock; a second NAND gate for outputting, in response to the data strobe falling signal, a mask signal and the ACTIVE signal, a data strobe falling bar signal synchronized with the falling edge of the data strobe signal, if a skew detection is complete; a latch for latching the WRITE signal and the data strobe falling bar signal and for outputting a write data strobe falling signal that is enabled from the falling edge of a clock to which the WRITE command is inputted to the falling edge of a first data strobe; a third NAND gate for generating a control signal, in response to the write data strobe falling signal and the mask signal; a third NOR gate for generating a reset signal in response to a window signal and the data strobe rising signal, if the skew detection is complete or the phase of the internal data strobe signal precedes the phase of the internal clock; and a third signal generator for generating the mask signal in response to the reset signal.

Preferably, the first signal generator includes: a switching means for applying a power voltage in response to an inversion signal of the WRITE command and the ACTIVE signal; and a latch for latching the power voltage applied by the switching means.

Preferably, the switching means includes: a PMOS transistor for applying, in response to the write signal, the power voltage to an output node; and an NMOS transistor for adjusting, in response to the ACTIVE signal, the potential of the output node to a ground voltage level.

Preferably, the second signal generator is a latch for latching the ACTIVE signal and the precharge signal, in response to a powerup signal.

Preferably, the third signal generator includes: a switching means for applying a power voltage to the output node, in response to the reset signal; and an NMOS transistor for adjusting, in response to the ACTIVE signal, the potential of the output node to a ground voltage level.

Preferably, the switching means includes: a PMOS transistor for applying, in response to the reset signal, the power voltage to an output node; and an NMOS transistor for adjusting, in response to the ACTIVE signal, the potential of the output node to a ground voltage level.

Preferably, the skew compensation circuit includes: a first input buffer for inputting the skew detection signal; a second input buffer for inputting the ACTIVE signal and generating a reset signal; an input driver for inputting the internal clock during a write operation; a forward delay array for delaying in a forward direction to measure a pulse width of the skew detection signal; a latch, which is initialized by the reset signal and adjusts a data to be latched according to an output of a delay unit of the forward delay array; a code converter having an opposite logic value to an initial value if the skew detection signal is inputted to the forward delay array, and generating a thermometer digital code corresponding to a width of the skew detection signal; a clock gate for inputting an output signal from the input driver and an output signal from the code converter; a backward delay array for delaying in an opposite direction by a pulse width of the skew detection signal measured in the forward delay array; and an output buffer for outputting an output signal from the backward delay array as a prewrite strobe signal.

The forward delay array consists of a plurality of delay units, each delay unit including: a first NAND gate for inputting the skew detection signal inputted through the first input buffer and an output signal from the preceding delay unit; and a second NAND gate for inputting an output signal from the first NAND gate and a power voltage.

The latch consists of a plurality of latch units, each latch unit including: two inverters, whereby a latch latches an output signal of the latch unit of the forward delay array and the output signal is inputted to the delay unit of the backward delay array; a first NMOS transistor for adjusting the potential of the latch, according to an output signal of the respective delay units of the forward delay array; and a second NMOS transistor for initializing the latch according to the reset signal.

The code converter consists of a plurality of NOR gates, and each of the NOR gates inputs an input voltage of the latch unit of the latch corresponding to the NOR gate and an output voltage of a next latch unit, and logically combines the voltages being inputted.

Preferably, the input driver includes: an NAND gate for inputting the internal clock and the write burst flag; and an inverter for inverting an output signal from the NAND gate.

The clock gate consists of a plurality of NAND gates, each of the NAND gate inputting an output signal from the input driver and an output signal from the NOR gate of the code converter.

The backward delay array for delaying in the opposite direction to the forward delay array consists of a plurality of delay units, each delay unit comprising: a first NAND gate for combining an output signal from the preceding delay unit and an output signal from the latch unit of the latch; and a second NAND gate for inputting an output signal from the first NAND gate and an output signal from the NAND gate of the clock gate.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

The following detailed description will present a preferred embodiment of the invention in reference to the accompanying drawings.

Figure 1:
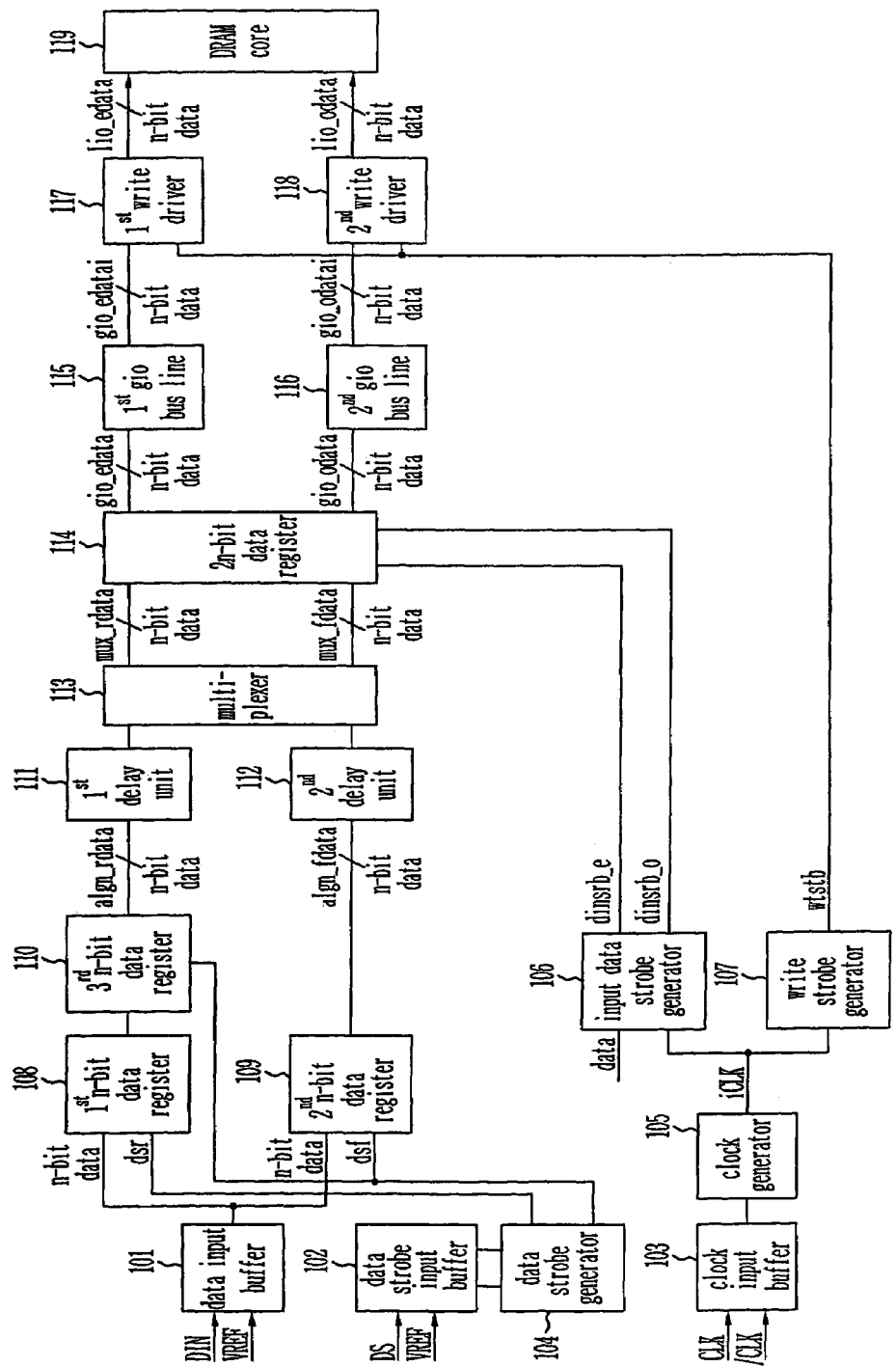
FIG. 1 is a block diagram related to a write operation of a related art DDR SDRAM.
Figure 2:
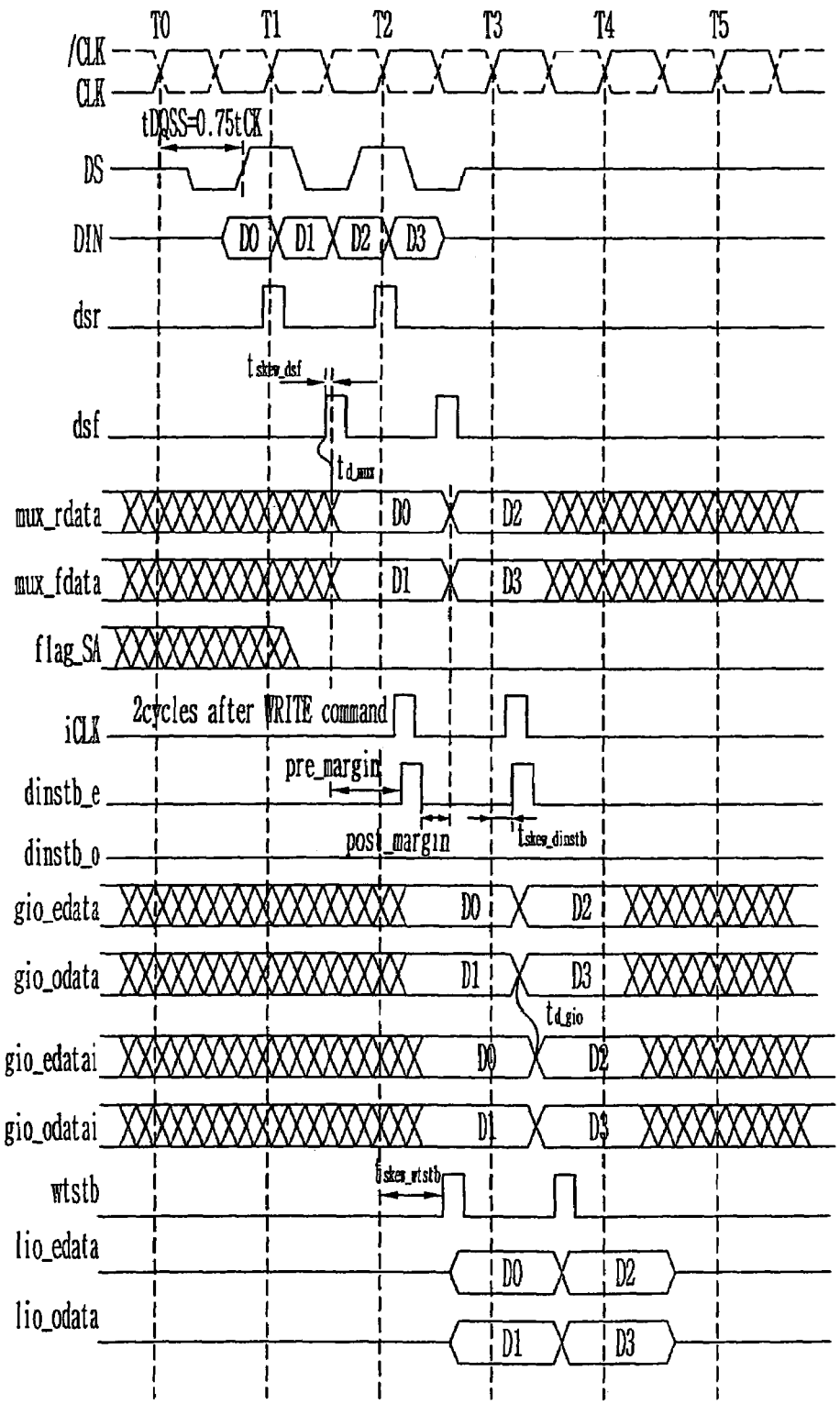
FIGS. 2 through 4 are timing diagrams related to a write operation of FIG. 1.
Figure 3:
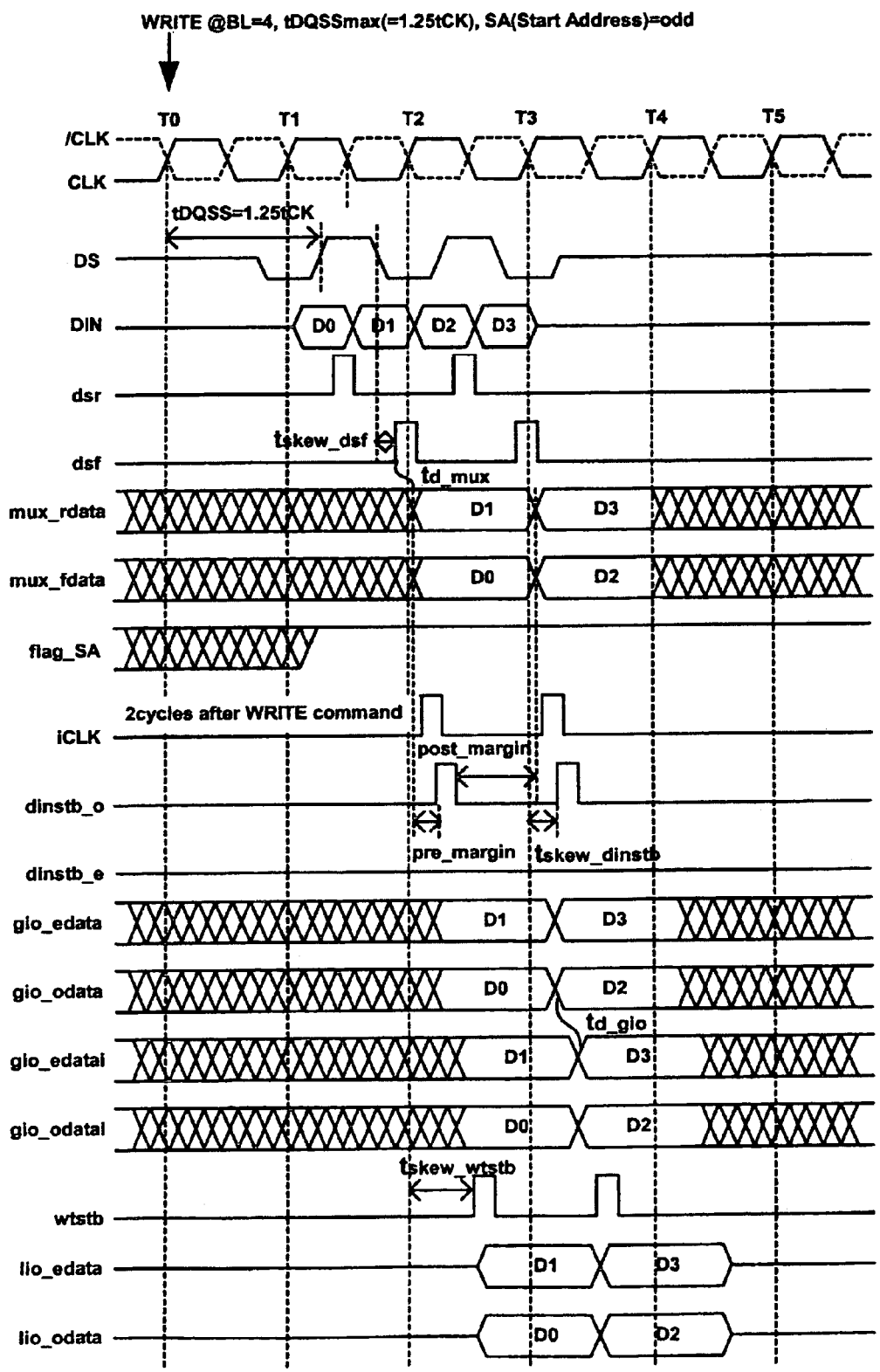
Figure 4:
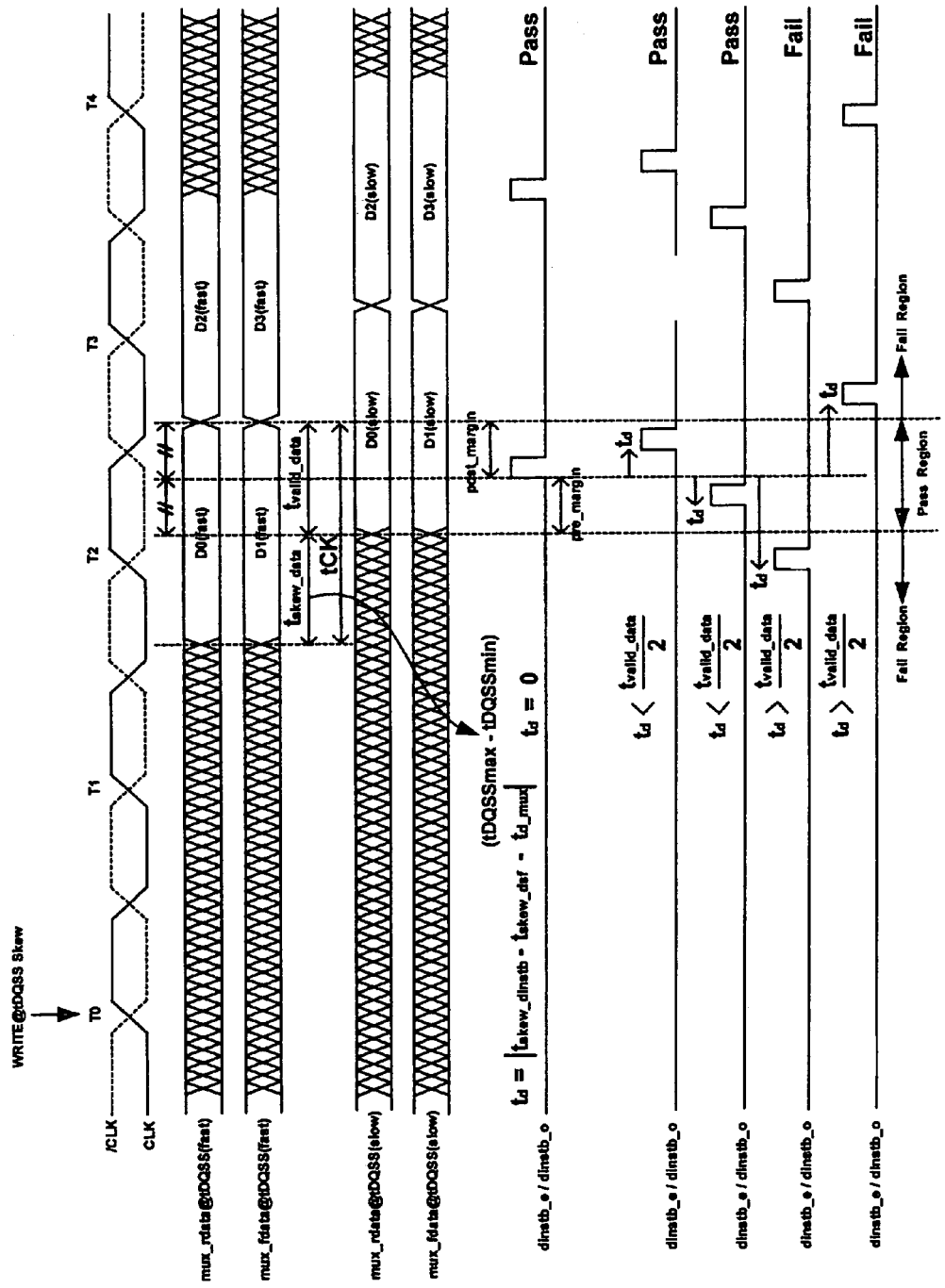
Figure 5:
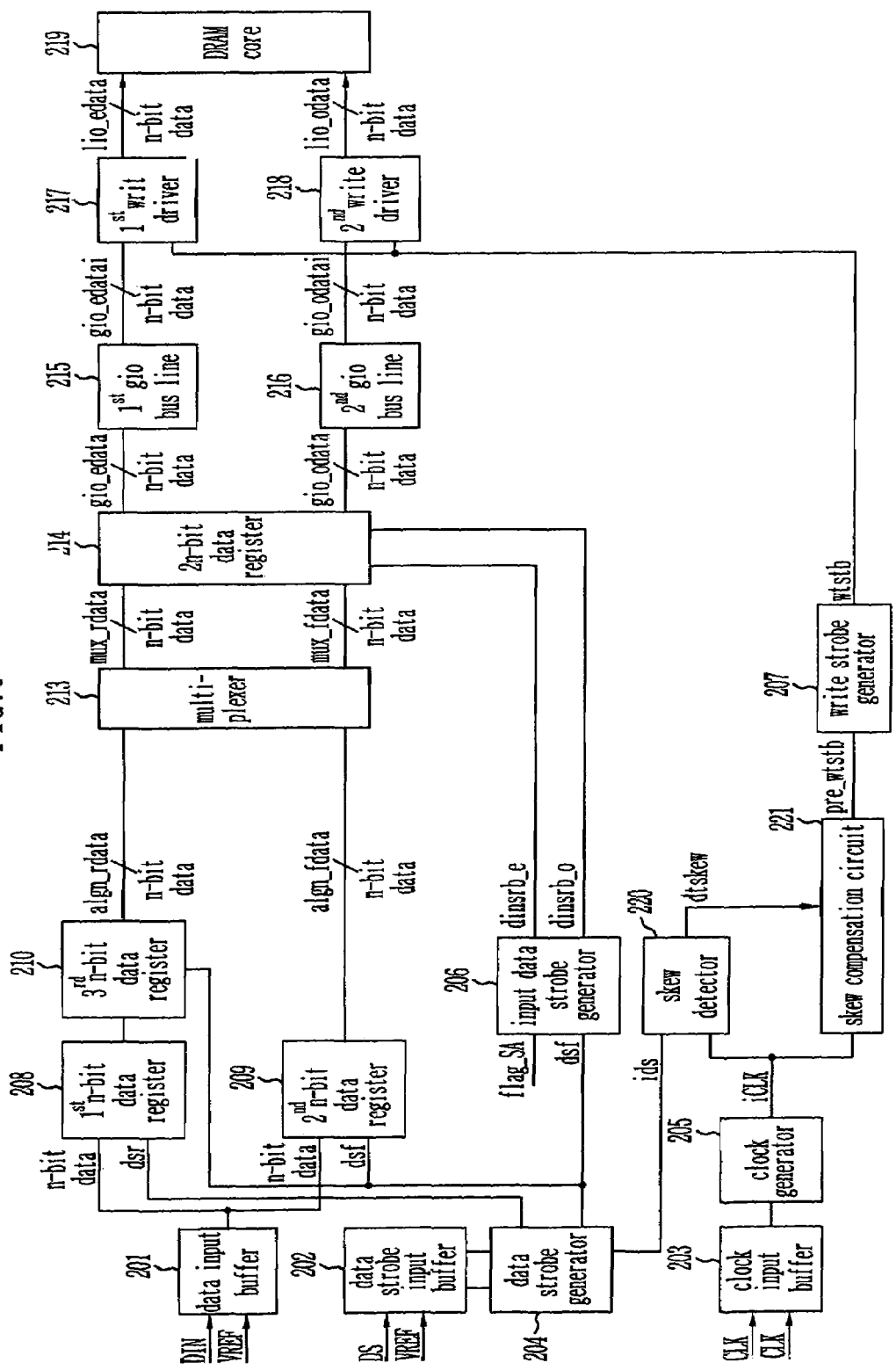
FIG. 5 is a block diagram related to a write operation of a DDR SDRAM according to the present invention.

FIG. 5 is a block diagram in relation to a write operation of a DDR SDRAM according to the present invention. There are several differences between the structure of the related art DDR SDRAM of FIG. 1 and that of the DDR SDRAM of the present invention. First of all, input data strobe signals dinstb_e and dinstb_o are not generated by an internal clock iCLK but by an internal data strobe ids, so different kinds of clock domain crossing are not generated at a 2n-bit data register. In fact, the clock domain crossing is generated at a write driver. Also, a write strobe wtstb, with an aid of a skew detector and a skew compensation circuit, generates a pre write strobe pre_wtstb without a tDQSS skew after a certain time of delay. Particularly, a direct synchronous mirror delay type DLL (Delay Locked Loop) used for the skew compensation circuit is a new device designed for a fast locking between a clock CLK and a data strobe DS.

The structure and operations related to a write operation of the DDR SDRAM according to the present invention will be explained with reference to FIG. 5.

A data input buffer 201 inputs an input data DIN and outputs an n-bit data, and the n-bit data is inputted to first and second n-bit data registers 208 and 209. A data strobe generator 204 inputs a data strobe through a data strobe buffer 202 and outputs a data strobe rising signal dsr, a data strobe falling signal dsf, and an internal data strobe signal ids. The data strobe rising signal dsr is inputted to the first n-bit data register 208, and the data strobe falling signal dsf is inputted to the second n-bit data register 209 and an input data strobe generator 206, and the internal data strobe signal ids is inputted to a skew detector 220. Here, if a data is inputted on the rising edge of clock, the data strobe rising signal dsr is inputted to the first n-bit data register 208, while if a data is inputted on the falling edge of clock, the data strobe falling signal dsf is inputted to the second n-bit data register 209 and the input data strobe generator 206, respectively.

The first n-bit data register 208 inputs an n-bit data and a data strobe rising signal dsr, and the second bit data register 209 inputs an n-bit data and a data strobe falling signal dsf. Also, a third n-bit data register 210 inputs the data stored in the first n-bit data register 208 and the data strobe falling signal dsf. In this way, the data on the rising edge of the clock as well as the data on the falling edge of the clock are arranged on the falling edge of the data strobe. Here, the data inputted to the first and second n-bit data registers 208 and 209 should satisfy setup time and hold time of the internal data strobe, i.e., the data strobe rising signal dsr and the data strobe falling signal dsf, respectively.

Two kinds of n-bit data algn_rdata and algn_fdata arranged in the data strobe falling signal dsf are inputted to a multiplexer 213. Then the multiplexer 213 outputs an n-bit data mux_rdata, mux_fdata by using those signals. The output data mux_rdata, mux_fdata from the multiplexer 213 are inputted to a 2n-bit data register 214.

An input data strobe generator 206 inputs a start address flag flag_SA and a data strobe falling signal dsf, and outputs a data input strobe even signal dinstb_e and a data input strobe odd signal dinstb_o. These signals are inputted to the 2n-bit data register 214. Here, the start address flag flag_SA has a low or high state value, depending whether a start address during a write operation is even or odd. When the start address is even, the data input strobe even signal dinstb_e is generated, while when the start address is odd, the data input strobe odd signal dinstb_o is generated.

A clock generator 205 generates an internal clock iCLK by inputting a clock CLK and its inversion signal /CLK which are inputted through a clock input buffer 203. The internal clock iCLK generated by the clock generator 205 is inputted to a skew detector 220 and a skew compensation circuit 221. The skew detector 220 inputs an input data strobe signal ids generated from the data strobe generator 204 and an internal clock iCLK generated from the clock generator 205, and detects a parameter tDQSS, which corresponds to a skew between a clock and a data strobe, and generates a skew detection signal dtskew, outputting a pulse width corresponding to (tDQSS–tCK). The skew compensation circuit 221 inputs the internal clock iCLK generated from the clock generator 205 and an output signal dtskew from the skew detector 220, and outputs a pre write strobe signal pre_wtstb without the tDQSS skew. Also, a write strobe generator 107 inputs a free write strobe signal pre_wtstb, and outputs a write strobe signal wtstb. This write strobe signal is then inputted to first and second write drivers 217 and 218.

The above-mentioned 2n-bit data register 214 classifies, in response to the data input strobe even signal dinstb_e and the data input strobe odd signal dinstb_o outputted from the input data strobe generator 206, the output data mux_rdata and mux_fdata from the multiplexer 213 into an even data gio_edata and an odd data gio_odata, and outputs the classified data. The even data gio_edata and the odd data gio_odata outputted from the 2n-bit data register 214 are inputted to the first and second write drivers 217 and 218 through first and second gio bus lines 215 and 216.

Lastly, the first and second write drivers 217 and 218 store the n-bit data gio_edata, gio_odata inputted through the first and second gio bus lines 215 and 216 in a DRAM core 219. More specifically, the write drivers are synchronized with a write strobe signal wtstb, which is generated by the write strobe generator 207 using the internal clock iCLK, and load the data on a local input/output bus line. In this case, the timing of the data write strobe signal wtstb is determined in consideration of the delays of the first and second gio bus lines 215 and 216 to the input data strobe signals dinstb_e and dinstb_o, and the set up time and the hold time of the first and second write drivers 217 and 218, respectively.

To be short, the write operation in the DDR SDRAM of the present invention is characterized of always transferring a proper data over the gio bus lines, without making a timing error. To this end, the data at the 2n-bit data register 214 is not synchronized to the internal clock iCLK, but to the internal data strobe signal ids itself. As a result, a timing margin caused by using different clocks does not occur. Further, as the skew compensation circuit 221 compensates the tDQSS in advance, the domain crossing between different clocks, which happens at the write drivers 217 and 218, can be overcome without considering the timing margin or the skew between different clocks.

Figure 6:
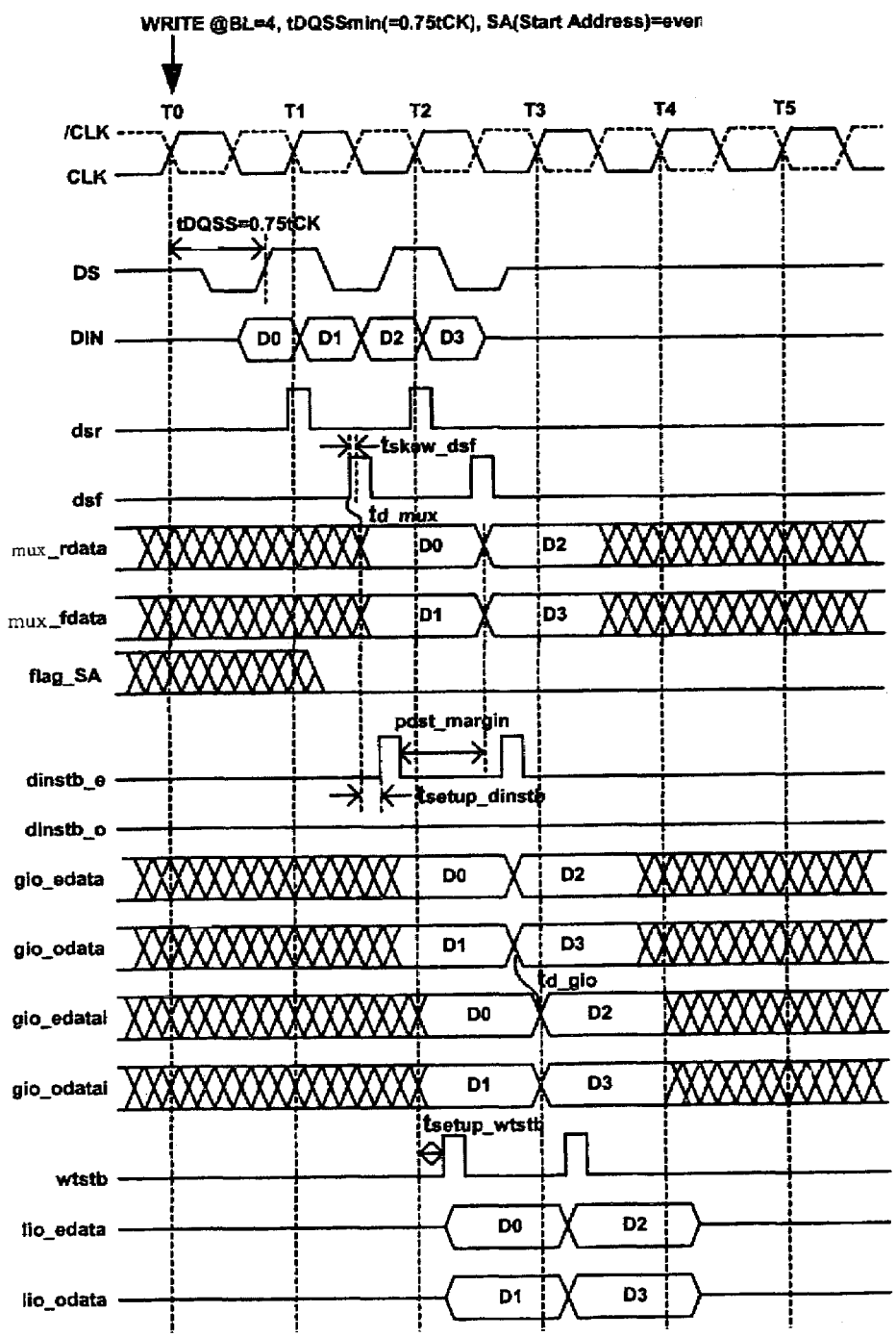
FIGS. 6 through 8 are block diagrams related to a write operation of FIG. 2.
Figure 7:
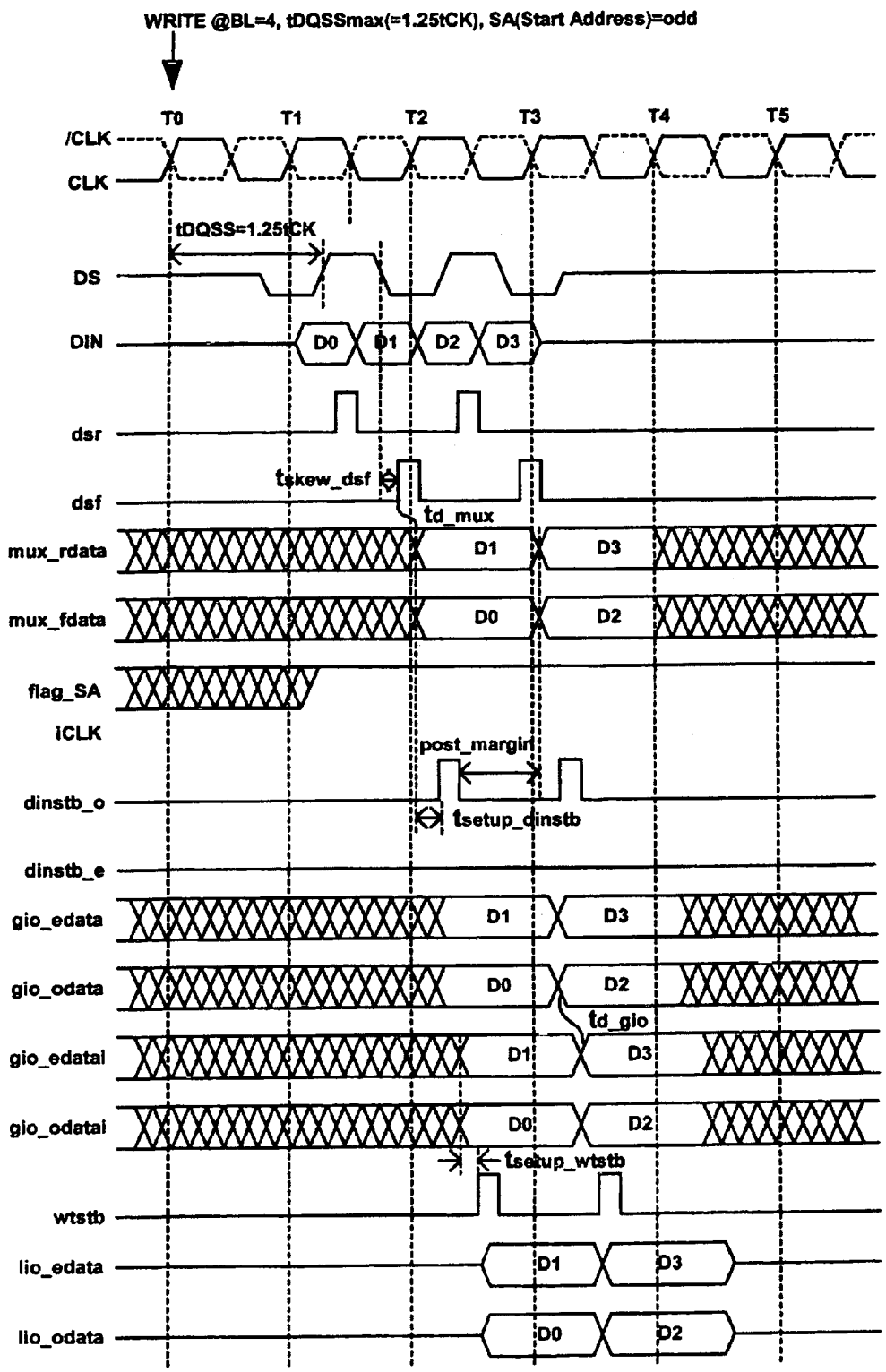

FIG. 6 and FIG. 7 are operation timing diagrams associated with a write operation of the DDR SDRAM according to the present invention, each illustrating a timing diagram at tDQSS_Min and tDQSS_Max, respectively.

FIG. 6 illustrates waveforms of each signal when a write command is inputted at T0, a burst length BL is 4, tDQSS is 0.75tCK, and a start address SA is even. At T1 and T2, the output data mux_rdata and mux_fdata from the multiplexer 213 is arranged synchronously with the internal data strobe falling signal dsf and the input data strobe even signal dinstb_e delays the data strobe falling signal dsf for a certain amount of time (td_mux+tsetup_dinstb). Therefore, the pre-margin pre_margin can be disregarded, and also the post margin post_margin covering a next data strobe falling signal dsf can be disregarded.

FIG. 7 illustrates waveforms of each signal when a write command is inputted at T0, a burst length BL is 4, tDQSS is 1.25tCK, and a start address SA is bdd. Similar to the case in FIG. 6, no timing margin, which is usually caused by the domain crossing between different clocks at the 2n-bit data register 214, is present in FIG. 7. One thing to be noted though in this case is a clock domain crossing timing problem generated at the first and second write drivers 217 and 218. Therefore, a timing diagram of FIG. 8 is provided to elaborate the above.

Figure 8:
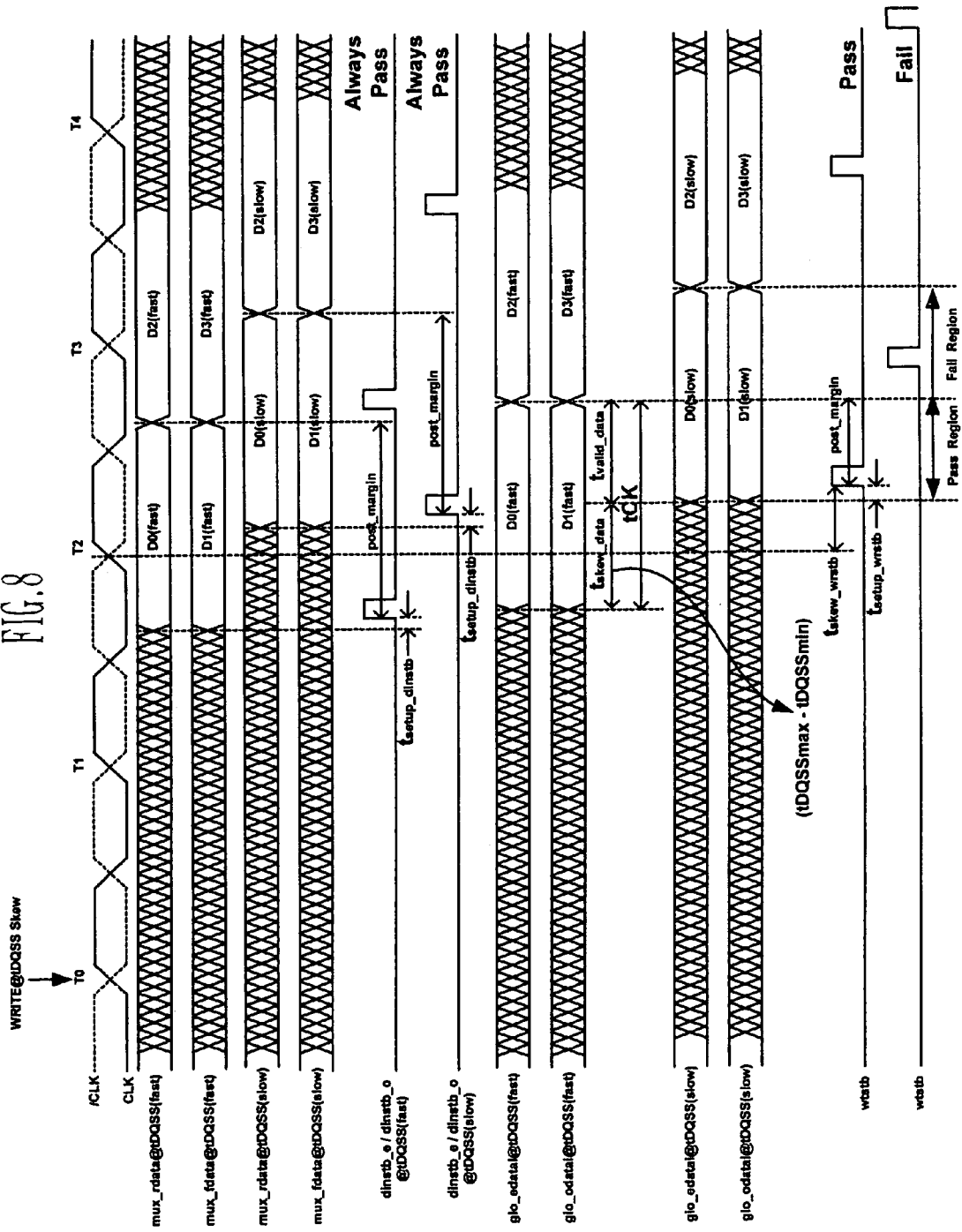

In FIG. 8, the write strobe signal wtstb is generated after T2, and write pass conditions can be described as described below.

$$tskew\_wrstb > tDQSS\_Max - tCK + tskew\_dsf + tsetup\_dinstb + td\_gio + tsetup\_wrstb.$$ [Mathematical Exprresion 1]

$$tskew\_wrstb < tDQSS\_Min - 0.5tCK + tskew\_dsf + tsetup\_dinstb + td\_gio + tsetup\_wrstb.$$ [Mathematical Expression 2]

[Mathematical Expression 1] and [Mathematical Expression 2] are conditions at tDQSS_Max and tDQSS_Min, respectively, and it is important that these two conditions are satisfied at the same time. 'tskew_wrstb' can be obtained as described below.

$$tskew\_wrstb = tcomp + tskew\_dsf + tsetup\_dinstb + td\_gio + tsetup\_wrstb,$$ [Mathematical Expression 3]

wherein tcomp denotes a skew compensation time.

By substituting [Mathematical Expression 3] to [Mathematical Expression 1] and [Mathematical Expression 2], the following expressions are obtained.

$$tcomp > tDQSS\_Max - tCK$$ [Mathematical Expression 4]

$$tcomp < tDQSS\_Min - 0.5tCK$$ [Mathematical Expression 5]

Meanwhile, if tDQSS value of the data strobe for the clock is less than 1tCK, no compensation is necessary for the skew, that is, tcomp=0. Hence, [Mathematical Expression 3] and [Mathematical Expression 5] can be simplified as described below, respectively.

$$tskew\_wrstb = tskew\_dsf + tsetup\_dinstb + td\_gio + tsetup\_wrstb$$ [Mathematical Expression 6]

$$0 < tDQSS\_Min - 0.5tCK$$ [Mathematical Expression 7]

In conclusion, [Mathematical Expression 4] and [Mathematical Expression 7] are the conditions necessary for write pass. Therefore, in the write operation as in FIG. 5, tDQSS_Min has a greater value than 0.5tCK, and tDQSS_Max should be less than (tcomp+tCK), resultantly depending on the tcomp value. If tcomp is designed to last as long as 0.5tCK, the tDQSS parameter value is extended from 0.5tCK to 1.5tCK. In such case, the write operation of the DDR SDRAM can have twice the timing margin at the maximum, compared to that of the related art. This means that a stable, high-speed write operation is made possible.

Figure 9:
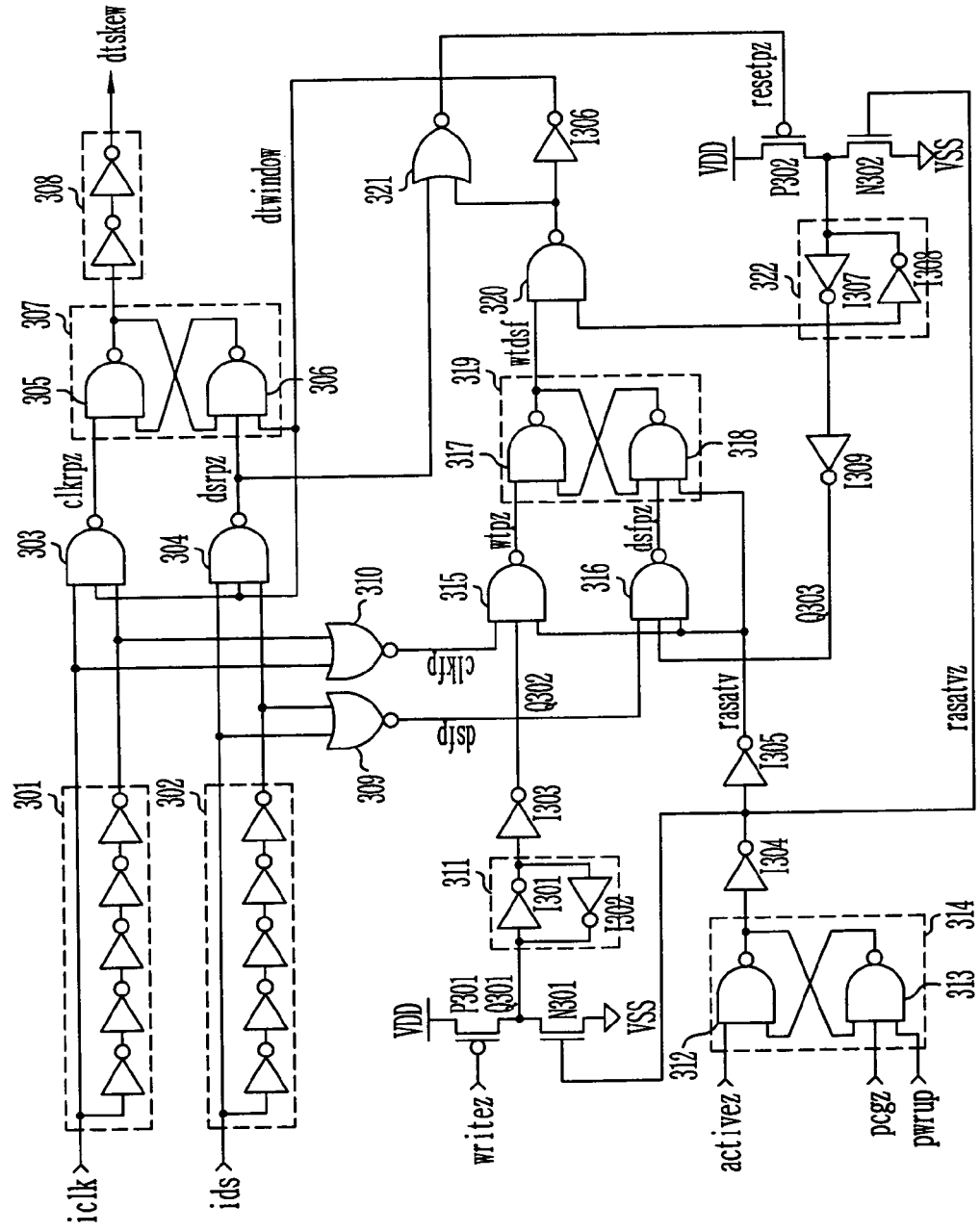
FIG. 9 is a circuit diagram of a skew detector applied to a write operation of a DDR SDRAM according to the present invention.

FIG. 9 is a circuit diagram of the skew detector applied to the write operation of the DDR SDRAM according to the present invention, in which a skew detection signal dtskew, detecting parameter tDQSS corresponding to a skew between the clock and the data strobe and outputting a pulse width corresponding to (tDQSS–tCK) is generated. More details are provided below.

A first delay unit 301 having a plurality of inverters delays an internal clock iclk, and a second delay unit 302 also having a plurality of inverters delays an internal data strobe signal ids.

A first NAND gate 303 inputs a window signal dtwindow, an internal clock iclk, and the delayed internal clock iclk through the first delay unit 301, and outputs a clock rising bar signal clkrpz. A second NAND gate 304 inputs a window signal dtwindow, an internal data strobe signal ids, and the delayed internal data strobe signal ids through the second delay unit 302, and outputs a data strobe rising bar signal dsrpz.

A first latch 307 consists of a third NAND gate 305 and a fourth NAND gate 306, inputting and latching the clock rising bar signal clkrpza and the data strobe rising bar signal dsrpz. The third NAND gate 305 inputs the cock rising bar signal clkrpz and an output signal from the fourth NAND gate 306. The fourth NAND gate 307 inputs the window signal dtwindow, the data strobe rising signal dsrpz, and an output signal from the third NAND gate 307. A data latched in the first latch 307 is outputted through an output driver 308 as a skew detection signal dtskew.

A first NOR gate 309 inputs the internal data strobe signal ids and the delayed internal data strobe signal ids through the second delay unit 302, and outputs a data strobe falling signal dsfp. A second NOR gate 310 inputs the internal clock iclk and the delayed internal clock iclk through the first delay unit 301, and outputs a clock falling signal clkfp.

A first PMOS transistor P301 is connected between a power terminal VDD and a first node Q301, and operates in response to a write bar signal writez. A first NMOS transistor N301 is connected between the first node Q301 and a ground terminal VSS, and operates in response to a ras active bar signal rasatvz, the output signal from a fourth inverter I304. A second latch 311, consisting of first and second inverts I301 and I302, latches the voltage at a first node Q301. A third inverter I303 inverts the second latch's output and determines the voltage at the second node Q302.

A third latch 314 consists of a fifth NAND gate 312 and a sixth NAND gate 313, and inputs an active bar signal activez and a precharge bar signal pcgz and latches the signals. Here, the fifth NAND gate 312 inputs the active bar signal activez and an output signal from the sixth NAND gate 313. The sixth NAND gate 313 inputs the precharge bar signal pcgz, an output signal from the fifth NAND gate 312, and a powerup signal pwrup. A fourth inverter I304 inverts an output signal from the second latch 314 to output the ras active bar signal rasatvz. Meanwhile, a fifth inverter I305 inverts the ras active bar signal rasatvz to output a ras active signal rasatv.

A seventh NAND gate 315 inputs the ras active signal rasatv, the clock falling signal clkfp, and the voltage at the second node Q302, and outputs a write bar signal wtpz. An eighth NAND gate 316 inputs the voltage at a third node Q303, which is determined by the ras active signal rasatv, the data strobe falling signal dsfp, and an output from a ninth inverter I309, and outputs a data strobe bar signal dsfpz.

A fourth latch 309, consisting of a ninth NAND gate 317 and a tenth NAND gate 318, latches the write bar signal wtpz and the data strobe falling bar signal dsfpz, and then outputs a write data strobe signal wtdsf. The ninth NAND gate 317 inputs the write bar signal wtpz and an output signal from the tenth NAND gate 318. The tenth NAND gate 318 inputs a data strobe falling bar signal dsfpz, an output signal from the ninth NAND gate 317, and the ras active signal rasatv.

An eleventh NAND gate 320 inputs the write data strobe signal wtdsf and a mask signal dtmask, which is the output signal from a fifth latch 322. A third NOR gate 321 inputs an output signal of the eleventh NAND gate 320 and a data strobe rising bar signal dsrpz, which is the output signal from the second NAND gate 304, and generates a reset bar signal resetpz. A sixth inverter I306 inverts the output signal from the eleventh NAND gate 320 and outputs the window signal dtwindow.

A second PMOS transistor P302 connected between the power terminal VDD and a fourth node Q304 operates in response to the reset bar signal resetpz. Also, a second NMOS transistor N302 connected between the fourth node Q304 and the ground terminal VSS operates in response to the ras active bar signal rasatvz.

A fifth latch 322, consisting of a seventh inverter I307 and an eight inverter I308, latches the voltage at the fourth node Q304, and outputs the mask signal dtmask. A ninth inverter I309 inverts the mask signal dtmask and determines the voltage at a third node Q303.

Figure 10:
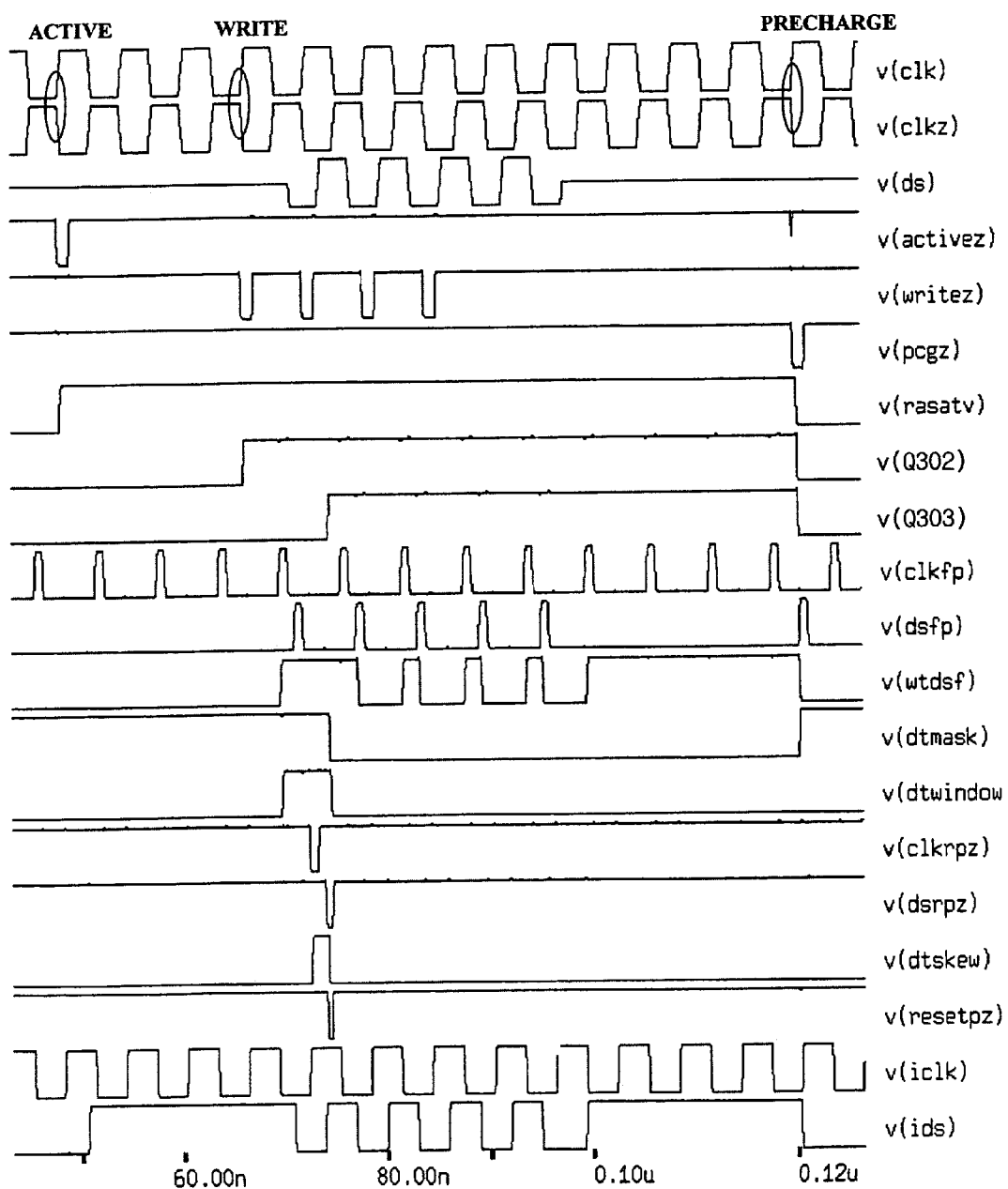
FIG. 10 is an operation timing diagram of FIG. 9.

An operating method of the skew detector of the invention with the above structure will be now explained with reference to an operation timing diagram in FIG. 10. Particularly, explained here is a method for detecting a skew that happens when a data strobe signal ds is inputted later than a clock. As shown in FIG. 10, an internal clock iclk is generated when the clock is applied, and a WRITE command is inputted after a bank ACTIVE command is inputted, and an internal data strobe signal ids is inputted as the data strobe signal ds is applied. The operating method of the skew driver to be explained below will follow the above-described order.

A) Application of ACTIVE Command

The internal clock iclk and the delayed internal clock iclk by the first delay unit 301 are locally combined with each other by the first NAND gate 303, and as a result, the clock rising bar signal clkrpz is outputted. The clock rising bar signal clkrpz goes to a low state when the window signal dtwindow is in a high state, and other than this case the clock rising bar signal clkrpz is kept to maintain its high state. In a similar way, the internal data strobe ids and the delayed internal data strobe signal ids by the second delay unit 302 are logically combined with each other by the second NAND gate 304, and outputs the data strobe rising bar signal dsrpz. The data strobe rising bar signal dsrpz goes to a low state when the window signal dtwindow is in a high state and except for this case, the data strobe rising bar signal dsrpz is kept to maintain its high state. The clock rising bar signal clkrpz maintained at a high state and the data strobe rising bar signal dsrpz maintained at a high state are latched together with the window signal dtwindow at a low state by the first latch 307, and as a result, the first latch 307 outputs a signal in a low state. The low state signal outputted from the first latch 307 is outputted through the output driver 308 as the skew detection signal dtskew in a low state.

The internal data strobe signal ids and the delayed internal data strobe signal ids through the second delay unit 302 are inputted to the first NOR gate 309 and are logically combined with each other therein. Only when the WRITE command is inputted and the internal data strobe signal ids transits from a high state to a low state does the first NOR gate 309 output the data strobe falling signal dsfp at a high state during the delay time of the second delay unit 302. Other than this case, the first NOR gate 309 outputs the data strobe falling signal dsfp at a low state. In a similar way, the internal clock signal iclk and the delayed internal clock signal iclk through the first delay unit 301 are inputted to the second NOR gate 310 and are logically combined with each other therein. Only when the WRITE command is inputted and the internal clock signal iclk transits from a high state to a low state does the second NOR gate 310 output the clock falling signal clkfp at a high state during the delay time of the first delay unit 301.

In the meantime, when a bank ACTIVE command is activated, the precharge bar signal pcgz is applied to a high state and the active bar signal activez is applied to a low state. Accordingly, the third latch 314 latches the active bar signal activez and outputs a high state signal, and the fourth inverter I304 inverts the output signal from the third latch 314 and outputs the ras active bar signal rasatvz at a low state. The ras active bar signal rasatvz in a low state turns off the first and second NMOS transistors N301 and N302. Moreover, the fifth inverter I305 inverts the ras active bar signal rasatvz in a low state and outputs the ras active signal rasatv in a high state. It is the ras active signal rasatv in a high state that enables the seventh and eighth NAND gates 315 and 316, and the fourth latch 319.

B) WRITE Command Input

When the WRITE command is inputted, the write bar signal wrtiez goes to a low state and the first PMOS transistor P301 is turned on. At this time, the first NMOS transistor N301 remains turned off by the ras active bar signal rasatvz in a low state. Therefore, the second latch 311 latches the voltage at the first node Q301 in a high state, and outputs a signal in a low state. The third inverter I303 inverts the low state output signal from the second latch 311, and the second node Q302 remains in a high state. That is, when the WRITE command is inputted (or issued), the second node Q302 is kept to maintain its high state.

On the other hand, the voltage at the second node Q302 in a high state, the clock falling signal clkfp in a low state, and the ras active signal rasatva in a high state are inputted to the seventh NAND gate 315, and the seventh NAND gate 315 outputs the write bar signal wtpz in a high state. Likewise, the voltage at the third node Q303 in a low state, the data strobe falling signal dsfp in a low state, and the ras active signal rasatva in a high state are inputted to the eighth NAND gate 316, and the eighth NAND gate 316 outputs the data strobe falling bar signal dsfpz in a high state. The write bar signal wtpz in a high state and the data strobe falling bar signal dsfpz in a high state are latched by the fourth latch 317, and the fourth latch 317 outputs the write data strobe falling signal wtdsf in a low state. The write data strobe falling signal wtdsf in a low state together with the mask signal dtmask in a high state, which is the output signal from the fifth latch 322, are inputted to the eleventh NAND gate 320, and the eleventh NAND gate 320 outputs a signal in a high state. This high state output signal from the eleventh NAND gate 320 is inverted through the sixth inverter I306 to the window signal dtwindow in a low state, and is inputted to the first and second NAND gates 303 and 304 and the fourth NAND gate 306 of the first latch 307, respectively. Therefore, the first NAND gate 303 outputs the clock rising bar signal clkrpz in a high state, and the second NAND gate 304 outputs the data strobe rising bar signal dsrpz in a low state. These output signals are latched by the first latch 307 and as a result, the first latch 307 outputs a signal in a low state. The low state output signal from the first latch 307 is delayed by the third delay unit 308 and is outputted as the skew detection signal in a low state.

The high state output signal from the eleventh NAND gate 320 becomes the reset bar signal resetpz in a high state by the third NOR gate 321 and the tenth inverter I310. In response to this high state reset bar signal resetpz, the second PMOS transistor P302 is turned off. Hence, the fifth latch 322 latches a previous data, and outputs the mask signal dtmask in a high state. The high state mask signal dtmask is inverted by the ninth inverter I309 to a low state, and is inputted to the eighth NAND gate 316.

C) Rising of Internal Clock and Falling of Internal Strobe Signal

Sometimes the internal data strobe signal is delayed and thus, is inputted after the internal clock is inputted. In such case, the internal clock is placed on the rising edge while the internal strobe signal is placed on the falling edge. The operation at this time will be described below.

After the WRITE command is inputted, the clock falling signal clkfp is inverted to a high state on the falling edge of the internal clock iclk. Because the input of the internal data strobe signal is delayed after the input of the internal clock iclk, the data strobe falling signal dsfp remains in a low state. Therefore, the first NAND gate 303 inputs the voltage of the second node Q302 in a high state, the clock falling signal clkfp in a high state, and the ras active signal rasatv in a high state, and then outputs the write bar signal wtpz in a low state. Moreover, the eighth NAND gate 316 inputs the voltage at the third node Q303 in a low state, the data strobe falling signal dsfp in a low state, and the ras active signal rasatv in a high state, and then outputs the data strobe falling bar signal dsfpz in a high state. The write bar signal wtpz in a low state and the data strobe falling bar signal dsfpz in a high state are latched by the fourth latch 317 and the fourth latch 317, in turn, outputs the write data strobe falling signal wtdsf in a high state. This write data strobe falling signal in a high state and the high state output signal dtmask from the fifth latch 322 are inputted to the eleventh NAND gate 320, and the eleventh NAND gate 320 outputs a signal in a low state. The low state output signal from the eleventh NAND gate 320 is inverted to the high state window signal dtwindow through the sixth inverter I306, and is inputted to the first and second NAND gates 303 and 304 and the fourth NAND gate 306 of the first latch 307. Therefore, the first NAND gate 303 outputs the clock rising bar signal clkrpz in a low state, and the signal is latched by the first latch 307 and is outputted as a high state signal. At this time, since the internal data strobe signal ids is inputted after the internal clock iclk is inputted, the data strobe rising bar signal dsrpz remains in a high state. The high state output signal from the first latch 307 is outputted as the skew detection signal dtskew in a high state through the output driver 308.

The low state output signal from the eleventh NAND gate 320 and the data strobe rising bar signal dsrpz in a high state are inputted to the third NOR gate 321, and the third NOR gate 321 outputs the reset bar signal resetpz in a low state. It is the low state reset bar signal resetpz that turns on the second PMOS transistor P302. Because the second NMOS transistor N302 is turned on by the ras active bar signal rasatvb in a low state, the fourth node Q304 goes to a high state. Therefore, the fifth latch 322 latches the voltage at the fourth node Q304, and outputs the mask signal dtmask in a low state. This low state mask signal dtmask is inverted to a high state by the ninth inverter I309 and is inputted to the eighth NAND gate 316.

D) Rising of Internal Clock and Falling of Internal Data Strobe

After the WRITE command is inputted, the clock falling signal clkfp goes to a low state on the rising edge of the internal clock iclk, and the data strobe falling signal dsfp goes to a high state on the falling edge of the internal data strobe signal ids. Therefore, the seventh NAND gate 315 inputs the voltage of the second node Q302 in a high state, the clock falling signal clkfp in a low state, and the ras active signal rasatv in a high state, and then outputs the write bar signal wtpz in a high state. Moreover, the eighth NAND gate 316 inputs the voltage at the third node Q303 in a high state, the data strobe falling signal dsfp in a high state, and the ras active signal rasatv in a high state and then outputs the data strobe falling bar signal dsfpz in a low state. The write bar signal wtpz in a high state and the data strobe falling bar signal dsfpz in a low state are latched by the fourth latch 317 and the fourth latch 317, in turn, outputs the write data strobe falling signal wtdsf in a low state. This write data strobe falling signal in a low state and the low state output signal dtmask from are inputted to the eleventh NAND gate 320, and the eleventh NAND gate 320 outputs a signal in a high state. The high state output signal from the eleventh NAND gate 320 is inverted to the low state window signal dtwindow through the sixth inverter I306, and is inputted to the first and second NAND gates 303 and 304 and the fourth NAND gate 306 of the first latch 307. Therefore, the clock rising bar signal clkrpz goes to a high state on the falling edge of the internal clock, and the data strobe rising bar signal dsrpz goes to a low state on the rising edge of the internal data strobe signal ids that is inputted after the internal clock is inputted. The clock rising bar signal clkrpz in a high state and the data strobe rising bar signal dsrpz in a low state are latched by the first latch 307, and the first latch 307 outputs a signal in a low state. This low state output signal from the first latch 307 is outputted as the skew detection signal dtskew in a low state through the output driver 308.

The high state output signal from the eleventh NAND gate 320 and the data strobe rising bar signal dsrpz in a high state are inputted to the third NOR gate 321, and the third NOR gate 321 outputs the reset bar signal resetpz in a high state. It is the high state reset bar signal resetpz that turns on the second PMOS transistor P302 and puts the fourth node Q304 in a high state. Therefore, the fifth latch 322 latches the voltage at the fourth node Q304 in a high state, and outputs the mask signal dtmask in a low state. The low state mask signal dtmask is inverted to a high state by the ninth inverter I309 and is inputted to the eighth NAND gate 316.

As described above, after the bank ACTIVE command the WRITE command are inputted, sometimes the input of the internal data strobe signal ids is delayed after the input of the internal clock iclk. Then the skew detection circuit of the present invention detects the skew between the internal clock and the data strobe signal, and outputs the skew detection signal dtskew. Namely, if tDQSS is greater than tCK, the skew detection signal dtskew is generated, but if not, a low state signal is always outputted.

On the other hand, the write data strobe signal wtdsf, after the WRITE command is inputted, remains in a high state from the falling edge of the internal clock iclk to the first falling edge of the internal data strobe signal ids. The window signal dtwindow is generated from the combination of the window width of the write data strobe signal wtdsf and the mask signal dtmask indicating that the detection of the skew has been complete. Hence, although the WRITE command is repeatedly inputted, the skew detection signal dtskew is issued only once when the WRITE command is inputted for the first time after the bank is activated. In other words, the full skew detection circuit operates, only responding to the first WRITE command after the bank is activated, and even though a burst write operation occurs continuously, the skew detection circuit disregards that. In this manner, malfunction of the skew detection circuit can be prevented and power consumption can be reduced. After the WRITE command is inputted, the skew detection signal dtskew goes to a high state on the rising edge of the internal clock and transits from the rising edge of the first data strobe signal to a low state, thereby detecting the skew between the clock and the data strobe signal.

Figure 11:
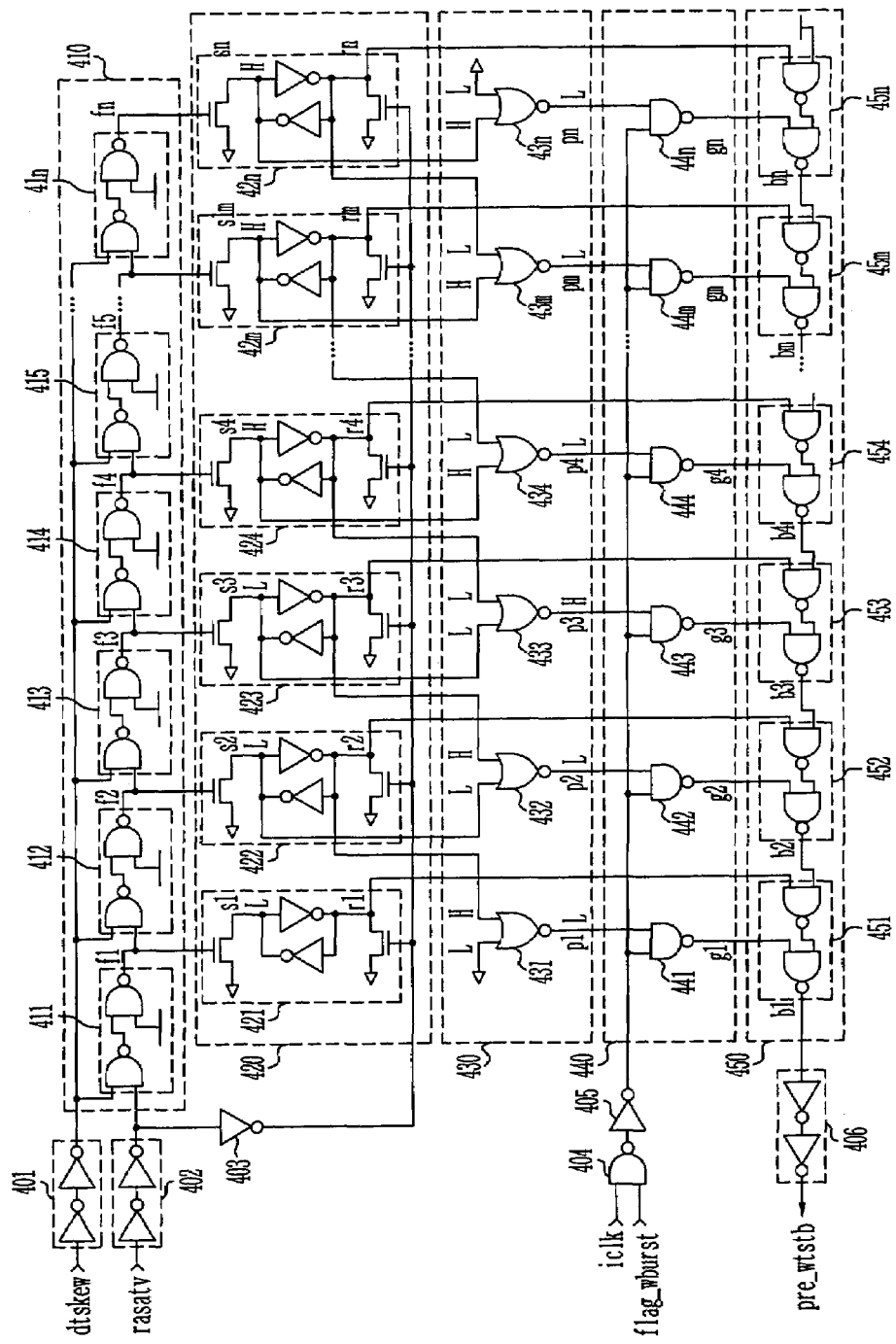
FIG. 11 is a skew compensation circuit diagram applied to a write operation of a DDR SDRAM according to the present invention.

FIG. 11 illustrates a skew compensation circuit according to the present invention. The structure of the skew compensation circuit will be now explained below.

A first input buffer 401, consisting of a plurality of inverters, inputs the skew detection signal dtskew from the skew detection circuit. A second input buffer 402, consisting of a plurality of inverters, input the ras active signal rasatv. A first inverter 403 inverts an output signal from the second input buffer 402 and generates a reset signal. The reset signal initializes the respective latches 421 to 42n consisting the latch unit 420.

A forward delay array 410 consists of a plurality of delay units 411 to 41n, and adjusts delay time of the ras active signal rasatv to the skew detection signal dtskew. Each delay unit 411 to 41n consists of a first NAND gate to which the skew detection signal dtskew inputted through the first input buffer 401 and an output signal of the preceding delay unit are inputted, and a second NAND gate to which an output signal from the first NAND gate and a power voltage. For example, the second delay unit 412 consists of the first NAND gate to which the skew detection signal dtskew inputted through the first input buffer 401 and the output signal of the first delay unit 411 are inputted, and the second NAND gate to which the output signal from the first NAND gate and the power voltage are inputted.

A latch 420 consists of a plurality of latch units 421 to 42n. A data to be latched by each latch unit 421 to 42n is adjusted according to outputs of the delay units 411 to 41n of the forward delay array, and the latched data in the respective latch units 421 to 42n of the forward delay array 410 are inputted to a respective latch unit 451 to 45n of a backward delay latch 450. Here, the respective latch units 421 to 42n consists of two inverters, a first NMOS transistor for adjusting the potential of a latch in response to an output signal from the delay units 411 to 41n of the forward delay array 410, respectively, and a second NMOS transistor for initializing the latch according to the reset signal.

A code converter 430 has an opposite logic value to an initial value when the skew detection signal dtskew is inputted to the forward delay array 410, and generates a thermometer digital code corresponding to the width of the skew detection signal dtskew. The code converter 430 consists of a plurality of NOR gates 431 to 43n, and the respective NOR gates 431 to 43n inputs an input voltage of a latch unit 421 to 42n of the latch 420 corresponding to the NOR gate and an output voltage of a next latch unit 421–42n, and logically combines the input/output voltages. For example, the second NOR gate 432 inputs the input voltage of the second latch 422 and the output voltage of the third latch 423.

A NAND gate 404 inputs an internal clock iclk and a write burst flag flag_wburst, and logically combines them. An inverter 405 inverts an output signal from the NAND gate 404. Therefore, the internal clock iclk is inputted during the burst write operation.

A clock gate 440 consists of a plurality of NAND gates 441 to 44n, and the respective NAND gates 441 to 44n inputs an output signal from the inverter 405 and an output signal from the respective NOR gate 431 to 43n, and logically combine the output signals.

A backward delay array 450 consists of a plurality of delay units 451 to 45n delayed in the opposite direction of the forward delay array 460. Each of the delay units 451 to 45n includes a first NAND gate for combining an output signal from the preceding delay unit and an output signal from the latch unit 421 to 42n of the latch 420, and a second NAND gate for inputting an output signal from the first NAND gate and an output signal from the NAND gate 441 to 44n of the clock gate 440.

An output buffer 406 outputs an output signal from the backward delay array 450 as a prewrite strobe bar signal pre_wtstb.

Figure 12:
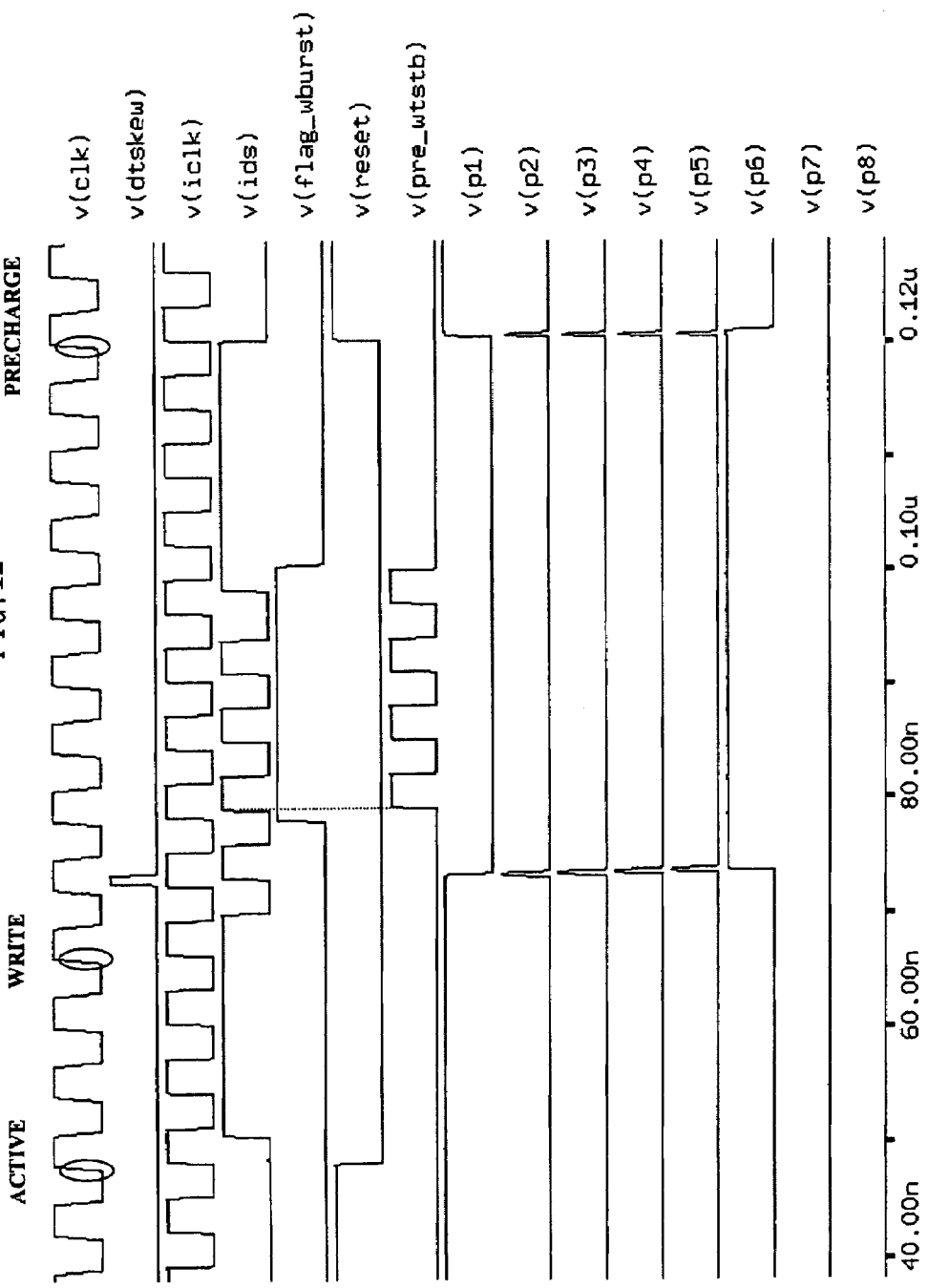
FIG. 12 is an operation timing diagram of FIG. 11.

The following will now explain the operating method of the skew compensation circuit of the invention, with reference to a timing diagram of FIG. 12.

At first, when the bank ACTIVE command is inputted synchronously with the clock clk, the latch 420 is initialized in response to the reset signal in a high state. When the WRITE command is inputted, a skew between the internal clock iclk and the internal data strobe signal ids is detected, generating the skew detection signal dtskew.

A skew detection signal dtskew inputted through the first input buffer 401 and a cas active signal casatv inputted through the second input buffer 402 are inputted to the forward delay array 410. In the forward delay array 410 output signals are delayed through the respective delay unit and are matched to each other during the delay. In other words, the skew detection signal dtskew and the cas active signal casatv are delayed through the respective delays units of the forward delay array 410, and are matched during the delay. Here, if an input signal is not matched, an output signal of a delay unit in the forward delay array 410 is outputted as a high state signal, but if the input signal is matched, the output signal of the delay unit is outputted as a low state signal. For instance, suppose that an input signal is matched in the fourth delay unit 414. Then, output signals from the first to the third delay unit 411 to 413 go to a high state, and output signals from the fourth to the n-th delay unit 414–41n go to a low state.

In the meantime, a latched data by the respective latch units 421 to 42n of the latch 420 is adjusted in response to an output signal from the respective delay units 411 to 41n of the forward delay array 410. For example, because the first to the third delay unit 411 to 413 outputs a signal in a high state while the fourth to the n-th delay unit 414 to 41*n* outputs a signal in a low state, the input terminal from the first to the third latch 421 to 423 becomes low while the input terminal from the fourth to the n-th latch units 421 to 42*n* becomes high. That is to say, the output terminal of the first to the third latch unit 421 to 423 becomes high while the output terminal from the fourth to the n-th latch units 421 to 42*n* becomes low.

Also, the respective NOR gate 431 to 43*n* of the code converter 430 inputs an input voltage of the latch unit 421 to 42*n* of the latch 420 corresponding to the NOR gate and output voltage of a next latch unit 421 to 42*n*, and logically combine them. For example, the third NOR gate 433 inputs the voltage at the input terminal of the third latch unit 423 in a low state and the voltage at the output terminal of the fourth latch unit 424 in a high state, and outputs a high state signal, while the other NOR gates output low state signals.

After the WRITE command is inputted, the write burst flag signal flag_wburst transits from a low state to a high state in 2 clocks, and when the WRITE operation is complete, the signal transits from a low state to a high state. The NAND gate 404 inputting the internal clock iclk and the write burst flag signal flag_wburst decides, if the write burst flag signal flag_wburst is at a high state, the state of an output signal according to the state of the internal clock iclk. For instance, if the internal clock iclk in a high state is inputted, a low state signal is outputted, while if the internal clock iclk in a low state is inputted, a high state signal is outputted. Then the inverter 405 inverts the output signal from the NAND gate 404 and outputs a signal having the same phase as the internal clock iclk. This output signal of the inverter 405 is inputted to the respective NAND gates 441 to 44*n*, but only the third NAND gate 443 inputs A high state output signal of the third NOR GATE 433 of the code converter 430, so an output signal thereof has the opposite phase to the output signal from the inverter 405. In other words, the third NAND gate 443 outputs a signal in a low state if the output signal of the inverter 405 is in a high state. But if the output signal of the inverter 405 is in a low state, the third NAND gate 443 outputs a signal in a high state. At this time, the other NAND gates always output high state signals.

An output signal of the respective latch units 421 to 42*n* of the latch 420 and an output signal of the respective NAND gates 441 to 44*n* of the clock gate 440 are inputted to the backward delay array 450. Particularly, an output signal from the preceding delay unit and an output signal from the latch unit 421 to 42*n* of the latch 420 are inputted to the first NAND gate, and an output signal from the first NAND gate and an output signal from the NAND gate 441 to 44*n* of the clock gate 440 are inputted to the second NAND gate. Therefore, the backward delay array 450 is delayed again for the same amount of delay by the forward delay array 410, and then outputs a signal. The output signal from the backward delay array 450 is outputted through an output buffer 405 as the prewrite strobe bar signal pre_wtstb, and the prewrite strobe bar signal pre_wtstb is locked from the rising edge of a second pulse of the internal data strobe signal ids.

In conclusion, according to the write circuit of the DDR SDRAM of the invention, a clock domain crossing is generated during a data write operation and a proper data is always transferred to a gio bus line by using the delay of an internal data strobe signal's falling for a certain amount of time as an input data strobe bar signal. In addition, by using a skew detection circuit, it is possible to detect a skew tDQSS between a clock and a data strobe, and the skew tDQSS is automatically compensated by the skew compensation circuit. From the perspective of a timing error between the clock and the data strobe, the write operation of the DDR SDRAM has twice the timing margin (0.5tCK) compared to that of the related art. This means that a stable, high-speed write operation of the DDR SDRAM can be made possible.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A write circuit of a DDR SDRAM, comprising:
   a multiplexer for outputting, in response to a data strobe rising signal and a data strobe falling signal, a data on the rising edge and the falling edge;
   an input data strobe generator for outputting, according to a start address flag, a data input strobe even signal and a data input strobe odd signal by using the data strobe falling signal;
   a skew detector for detecting a skew between an internal clock and an internal data strobe signal and outputting a skew detection signal;
   a skew compensation circuit for controlling, in response to the skew detection signal, the internal clock and outputting a prewrite strobe signal with the skew compensated;
   a write strobe generator for outputting, in response to the prewrite strobe signal, a write strobe signal;
   a data register for classifying, in response to the data input strobe even signal and the data input strobe odd signal, a output data from the multiplexer into an even data and an odd data, and outputting the data through first and second gio bus lines; and
   first and second write driver for synchronizing the output data with the write strobe signal and inputting the data to a DRAM core through first and second local input/output bus lines.

2. The write circuit according to claim 1, wherein the write address flag has values in different states, depending on whether the start address is even or odd during a write operation.

3. The write circuit according to claim 1, wherein if the start address flag is an even address, the input data strobe generator generates the data input strobe even signal, and if the start address flag is an odd address, the input data strobe generator generates the data input strobe odd signal.

4. The write circuit according to claim 1, wherein the skew detector comprises:
   a detector for detecting, after an ACTIVE command and a WRITE command are inputted, the skew caused by delay of the internal strobe signal relatively to the internal clock; and
   a controller for controlling the detector to detect skew only when the WRITE command is inputted for the first time after the ACTIVE command is inputted.

5. The write circuit according to claim 4, wherein the detector comprises:
   a first NAND gate for inputting, in response to a control signal of the controller, the internal clock and the delayed internal clock by a certain amount of time, and outputting a clock rising signal on the rising edge of the internal clock;

a second NAND gate for inputting, in response to the control signal of the controller, the internal data strobe signal and the delayed internal data strobe signal by a certain amount of time, and outputting a data strobe rising signal on the rising edge of the internal data strobe signal; and a latch for latching, in response to the control signal of the controller, the clock rising signal and the data strobe rising signal, and outputting the skew detection signal.

6. The write circuit according to claim 4, wherein the controller comprises:

a first signal generator for generating a WRITE signal, in response to the WRITE command;

a second signal generator for generating an ACTIVE signal, in response to an ACTIVE signal and a precharge signal;

a first NOR gate for inputting the internal clock and the delayed internal clock by a certain amount of time and outputting a clock falling signal on the falling edge of the internal clock;

a second NOR gate for inputting the internal data strobe signal and the delayed internal data strobe signal by a certain amount of time and outputting a data strobe falling signal on the falling edge of the internal data strobe;

a first NAND gate for outputting, in response to the clock falling signal, the WRITE signal and the ACTIVE signal, a write signal for synchronizing the WRITE command to the falling edge of the internal clock;

a second NAND gate for outputting, in response to the data strobe falling signal, a mask signal and the ACTIVE signal, a data strobe falling bar signal synchronized with the falling edge of the data strobe signal, if a skew detection is complete;

a latch for latching the WRITE signal and the data strobe falling bar signal and for outputting a write data strobe falling signal that is enabled from the falling edge of a clock to which the WRITE command is inputted to the falling edge of a first data strobe;

a third NAND gate for generating a control signal, in response to the write data strobe falling signal and the mask signal;

a third NOR gate for generating a reset signal in response to a window signal and the data strobe rising signal, if the skew detection is complete or the phase of the internal data strobe signal precedes the phase of the internal clock; and a third signal generator for generating the mask signal in response to the reset signal.

7. The write circuit according to claim 6, wherein the first signal generator comprises:

a switching means for applying a power voltage in response to an inversion signal of the WRITE command and the ACTIVE signal; and a latch for latching the power voltage applied by the switching means.

8. The write circuit according to claim 7, wherein the switching means comprises:

a PMOS transistor for applying, in response to the write signal, the power voltage to an output node; and an NMOS transistor for adjusting, in response to the ACTIVE signal, the potential of the output node to a ground voltage level.

9. The write circuit according to claim 6, wherein the second signal generator is a latch for latching the ACTIVE signal and the precharge signal, in response to a powerup signal.

10. The write circuit according to claim 6, wherein the third signal generator comprises:

a switching means for applying a power voltage to the output node, in response to the reset signal; and an NMOS transistor for adjusting, in response to the ACTIVE signal, the potential of the output node to a ground voltage level.

11. The write circuit according to claim 10, wherein the switching means comprises:

a PMOS transistor for applying, in response to the reset signal, the power voltage to an output node; and an NMOS transistor for adjusting, in response to the ACTIVE signal, the potential of the output node to a ground voltage level.

12. The write circuit according to claim 1, wherein the skew compensation circuit comprises:

a first input buffer for inputting the skew detection signal;

a second input buffer for inputting the ACTIVE signal and generating a reset signal;

an input driver for inputting the internal clock during a write operation;

a forward delay array for delaying in a forward direction to measure a pulse width of the skew detection signal;

a latch, which is initialized by the reset signal and adjusts a data to be latched according to an output of a delay unit of the forward delay array;

a code converter having an opposite logic value to an initial value if the skew detection signal is inputted to the forward delay array, and generating a thermometer digital code corresponding to a width of the skew detection signal;

a clock gate for inputting an output signal from the input driver and an output signal from the code converter;

a backward delay array for delaying in an opposite direction by a pulse width of the skew detection signal measured in the forward delay array; and an output buffer for outputting an output signal from the backward delay array as a prewrite strobe signal.

13. The write circuit according to claim 12, wherein the forward delay array consists of a plurality of delay units, each delay unit comprising:

a first NAND gate for inputting the skew detection signal inputted through the first input buffer and an output signal from the preceding delay unit; and a second NAND gate for inputting an output signal from the first NAND gate and a power voltage.

14. The write circuit according to claim 12, wherein the latch consists of a plurality of latch units, each latch unit comprising:

two inverters, whereby a latch latches an output signal of the latch unit of the forward delay array and the output signal is inputted to the delay unit of the backward delay array;

a first NMOS transistor for adjusting the potential of the latch, according to an output signal of the respective delay units of the forward delay array; and a second NMOS transistor for initializing the latch according to the reset signal.

15. The write circuit according to claim 12, wherein the code converter consists of a plurality of NOR gates, and each of the NOR gates inputs an input voltage of the latch unit of the latch corresponding to the NOR gate and an output voltage of a next latch unit, and logically combines the voltages being inputted.

16. The write circuit according to claim 12, wherein the input driver comprises:

an NAND gate for inputting the internal clock and the write burst flag; and an inverter for inverting an output signal from the NAND gate.

17. The write circuit according to claim 12, wherein the clock gate consists of a plurality of NAND gates, each of the NAND gate inputting an output signal from the input driver and an output signal from the NOR gate of the code converter.

18. The write circuit according to claim 12, wherein the backward delay array for delaying in the opposite direction to the forward delay array consists of a plurality of delay units, each delay unit comprising:

a first NAND gate for combining an output signal from the preceding delay unit and an output signal from the latch unit of the latch; and a second NAND gate for inputting an output signal from the first NAND gate and an output signal from the NAND gate of the clock gate.

* * * * *

UNITED STATES PATENT AND TRADEMARK OFFICE
CERTIFICATE OF CORRECTION

PATENT NO. : 7,042,799 B2 Page 1 of 1
APPLICATION NO. : 10/880381
DATED : May 9, 2006
INVENTOR(S) : Yong D. Cho It is certified that error appears in the above-identified patent and that said Letters Patent is hereby corrected as shown below:

In the Claims:

Column 18, line 35, "a output" should be -- an output --.

Column 21, line 7, "gate" should be -- gates --.

Signed and Sealed this

Ninth Day of January, 2007

JON W. DUDAS
*Director of the United States Patent and Trademark Office*